(12) United States Patent
Toda

(10) Patent No.: US 11,477,353 B2
(45) Date of Patent: Oct. 18, 2022

(54) IMAGE PICKUP APPARATUS WITH MOVABLE UNIT AND CONTROL UNIT CONNECTED TOGETHER BY FLEXIBLE BOARDS

(71) Applicant: CANON KABUSHIKI KAISHA, Tokyo (JP)

(72) Inventor: Daisuke Toda, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 16 days.

(21) Appl. No.: 17/240,136

(22) Filed: Apr. 26, 2021

(65) Prior Publication Data
US 2021/0250483 A1 Aug. 12, 2021

Related U.S. Application Data

(63) Continuation of application No. 16/598,297, filed on Oct. 10, 2019, now Pat. No. 1,112,290.

(30) Foreign Application Priority Data

Oct. 16, 2018 (JP) .............................. JP2018-195149
Jun. 25, 2019 (JP) .............................. JP2019-117500

(51) Int. Cl.
*H04N 5/225* (2006.01)
*H05K 1/14* (2006.01)

(52) U.S. Cl.
CPC ......... *H04N 5/22521* (2018.08); *H05K 1/148* (2013.01)

(58) Field of Classification Search
CPC .................................................. H04N 5/22521
(Continued)

(56) References Cited

U.S. PATENT DOCUMENTS

| 7,084,550 B2 | 8/2006 | Sasaki |
| 8,638,569 B2 | 1/2014 | Sotsu |
| 8,767,120 B2 | 7/2014 | Takizawa |

FOREIGN PATENT DOCUMENTS

| CN | 1601315 A | 3/2005 |
| JP | 2007041418 A | 2/2007 |

(Continued)

OTHER PUBLICATIONS

Extended European Search Report issued in European Appln. No. 19202662.3 dated Feb. 21, 2020.
(Continued)

*Primary Examiner* — Joel W Fosselman
(74) *Attorney, Agent, or Firm* — Rossi, Kimms & McDowell LLP

(57) ABSTRACT

An image pickup apparatus which makes the load applied to a movable unit when it is displaced nearly uniform. The movable unit controlled by a control unit is capable of being in at least a predetermined direction. A first flexible board has a first connecting portion connected to the movable unit, a first wiring portion extended from the first connecting portion in a first direction different from a direction of an optical axis, and a second connecting portion placed at an end of the first wiring portion and connected to the control unit. A second flexible board has a third connecting portion connected to the movable unit, a second wiring portion extended from the third connecting portion in a second direction different from the direction of the optical axis, and a fourth connecting portion placed at an end of the second wiring portion and connected to the control unit.

4 Claims, 16 Drawing Sheets

(58) Field of Classification Search
USPC .......................................................... 348/374
See application file for complete search history.

(56) References Cited

FOREIGN PATENT DOCUMENTS

| | | | |
|---|---|---|---|
| JP | 2010192749 A | | 9/2010 |
| JP | 2011066580 | * | 3/2011 |
| JP | 2011066580 A | | 3/2011 |
| KR | 1020110123209 A | | 11/2011 |

OTHER PUBLICATIONS

Extended European Search Report issued in European Appln. No. 20171317.9 dated Aug. 10, 2020.
Office Action issued in U.S. Appl. No. 16/598,297 dated Oct. 23, 2020.
Notice of Allowance issued in U.S. Appl. No. 16/598,297 dated Feb. 3, 2021.
Office Action issued in Chinese Appln. No. 201910972932.5 dated Apr. 20, 2021. English machine translation provided.

* cited by examiner

900

IMAGE PICKUP APPARATUS WITH MOVABLE UNIT AND CONTROL UNIT CONNECTED TOGETHER BY FLEXIBLE BOARDS

BACKGROUND OF THE INVENTION

Field of the Invention

The present invention relates to an image pickup apparatus, in which a movable unit capable of displacement and a control unit are connected together by flexible boards.

Description of the Related Art

Conventionally, electronic equipment such as an image pickup apparatus in which a movable unit, which is supported by a fixed unit (supporting unit) such that it can be displaced, and a control unit are connected together by flexible boards is known. For example, in an image pickup apparatus with a function of optically correcting for blurring of a subject, a movable unit that supports an image pickup device is displaced with respect to a fixed unit in a direction perpendicular to an optical axis to correct for blurring of a subject.

The movable unit is equipped with a circuit board on which the image pickup device is mounted, and electric connecting parts such as connectors are also mounted on this circuit board. The fixed unit such as a case that holds the movable unit is equipped with a control unit that drivingly controls the movable unit, and electric connecting parts such as connectors are also mounted on this control board. The connectors in the movable unit and the connectors in the fixed unit are electrically connected together by a flexible board. By using flexibility of the flexible board, the fixed unit and the movable unit are electrically connected together, and the movable unit is controlled by the control unit (Japanese Laid-Open Patent Publication (Kokai) No. 2010-192749).

A part of wiring on the flexible board is capable of being deformed in response to displacement of the movable unit. However, a reaction force generated by deformation of the wiring acts as a load in driving the movable unit. Depending on the layout of the flexible board, the reaction force generated by the deformation of the wiring may become unbalanced, making control complicated when driving the movable unit. For example, when the movable unit is displaced in a certain direction, and a reaction force is generated in a direction perpendicular to the direction in which the movable unit is displaced, control is required for the direction perpendicular to the direction of the displacement as well.

In recent years, with increase in pixel resolution of moving images in image pickup apparatuses and improvement of functions such as high-speed sequential shooting, power consumption of an image pickup device and the number of signals connected have continuously increased. For this reason, the width of the flexible board has increased, and also the load arising from the flexible board has increased, making the above problems more serious.

It should be noted that to reduce the load, it can be considered that the length of a flexible portion of the flexible board is increased to reduce the amount of deformation per unit length so that the reaction force generated by the deformation can be decreased. However, this is not enough to balance the load and also increases the space in which the flexible board is housed, leading to upsizing of the image pickup apparatus.

SUMMARY OF THE INVENTION

The present invention makes the load, which is applied to a movable unit when it is displaced, nearly uniform.

Accordingly, the present invention provides an image pickup apparatus that includes: an image pickup device configured to convert an optical image of a subject into an electric signal; a movable unit configured to hold the image pickup device and to be capable of being displaced in a direction different from a direction of an optical axis of an image pickup optical system; a control unit including a circuit to which an image pickup signal output from the image pickup device is transmitted; a first flexible board configured to electrically connect the movable unit and the control unit with each other; and a second flexible board configured to electrically connect the movable unit and the control unit with each other, wherein the first flexible board comprises a first connecting portion that is connected to the movable unit, a first wiring portion that is extended from the first connecting portion in a first direction different from the direction of the optical axis, and a second connecting portion that is placed at an end of the first wiring portion and connected to the control unit, and wherein the second flexible board comprises a third connecting portion that is connected to the movable unit, a second wiring portion that is extended from the third connecting portion in a second direction different from the direction of the optical axis and opposite to the first direction, and a fourth connecting portion that is placed at an end of the second wiring portion and connected to the control unit.

According to the present invention, the load, which is applied to a movable unit when it is displaced, is made nearly uniform.

Further features of the present invention will become apparent from the following description of exemplary embodiments (with reference to the attached drawings).

DESCRIPTION OF THE EMBODIMENTS

Embodiments of the present invention will now be described with reference to the drawings.

Figure 1A:
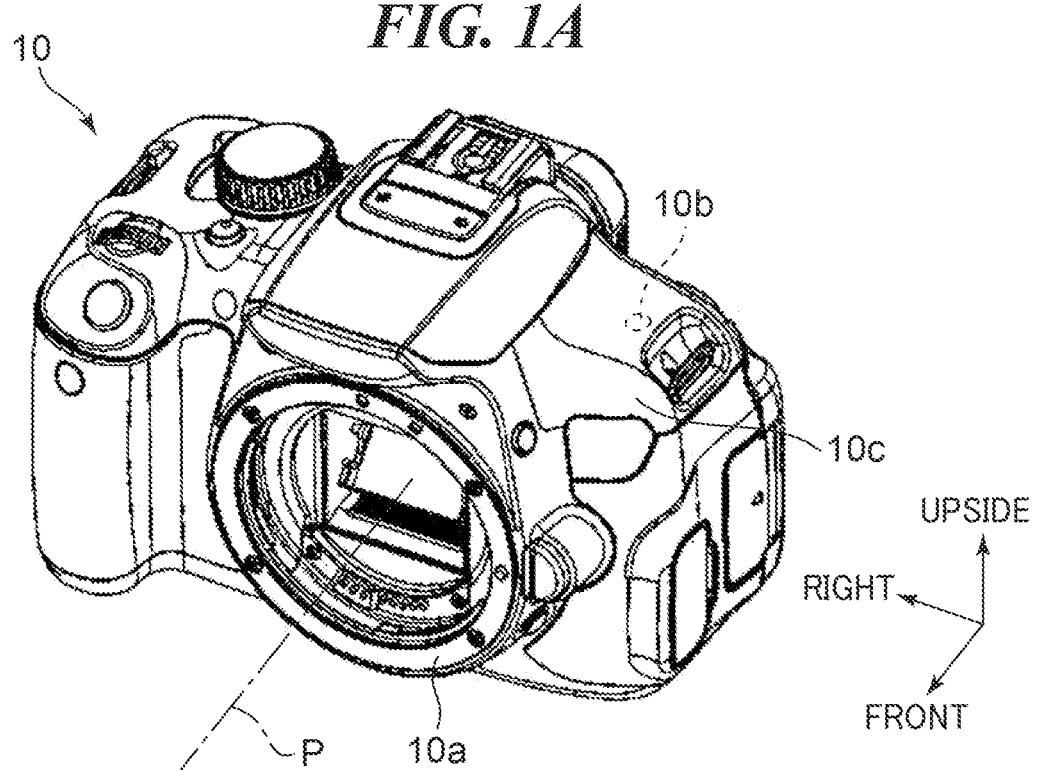
FIGS. 1A and 1B are perspective views of an electronic device.
Figure 1B:
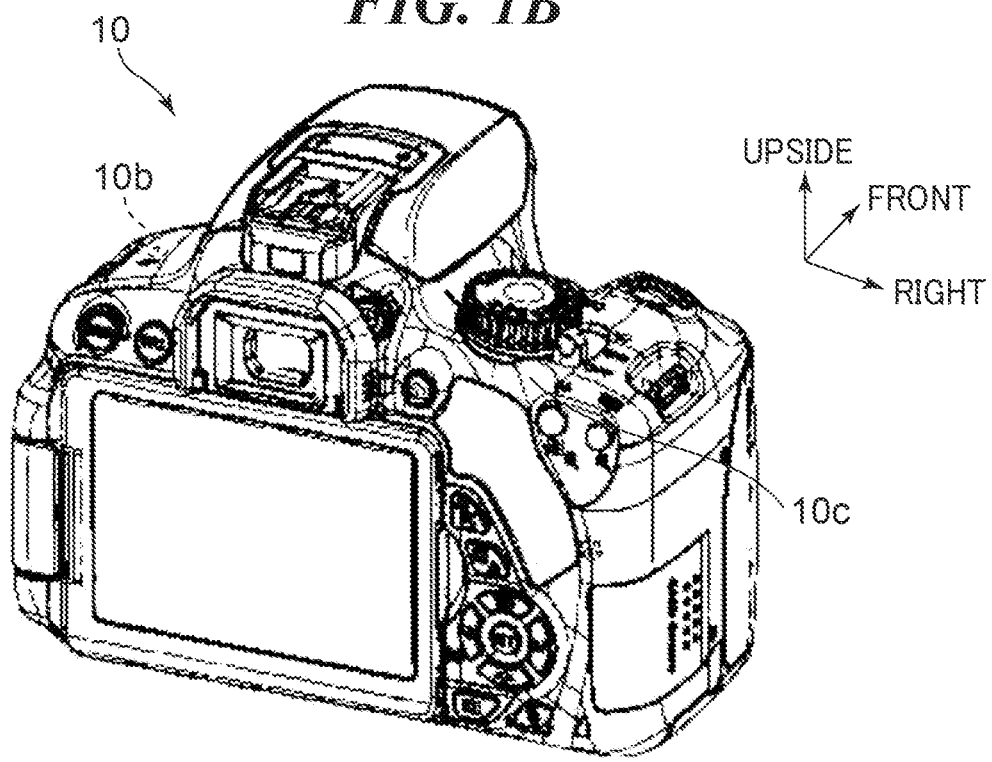

FIGS. 1A and 1B are perspective views of an electronic device according to a first embodiment of the present invention. An image pickup apparatus 10 is illustrated as the electronic device to which the present invention is applied. A vertical direction, front and rear, and horizontal direction are defined as directions of the image pickup apparatus 10 as seen from a photographer (user) as a reference. Thus, FIG. 1A is a perspective view of the image pickup apparatus 10 as seen from the front (subject side), and FIG. 1B is a perspective view of the image pickup apparatus 10 as seen from the rear (photographer side). The image pickup apparatus 10 is covered with an exterior 10c which is a case comprised of a plurality of members. A mount 10a is provided on a front side of the image pickup apparatus 10. An interchangeable lens (image pickup optical system), not shown, is mountable on the mount 10a. A wireless antenna 10b is built at a left end of an upper part of the image pickup apparatus 10. An axis passing through the center of the mount 10a substantially corresponds to an imaging optical axis P.

Figure 2:
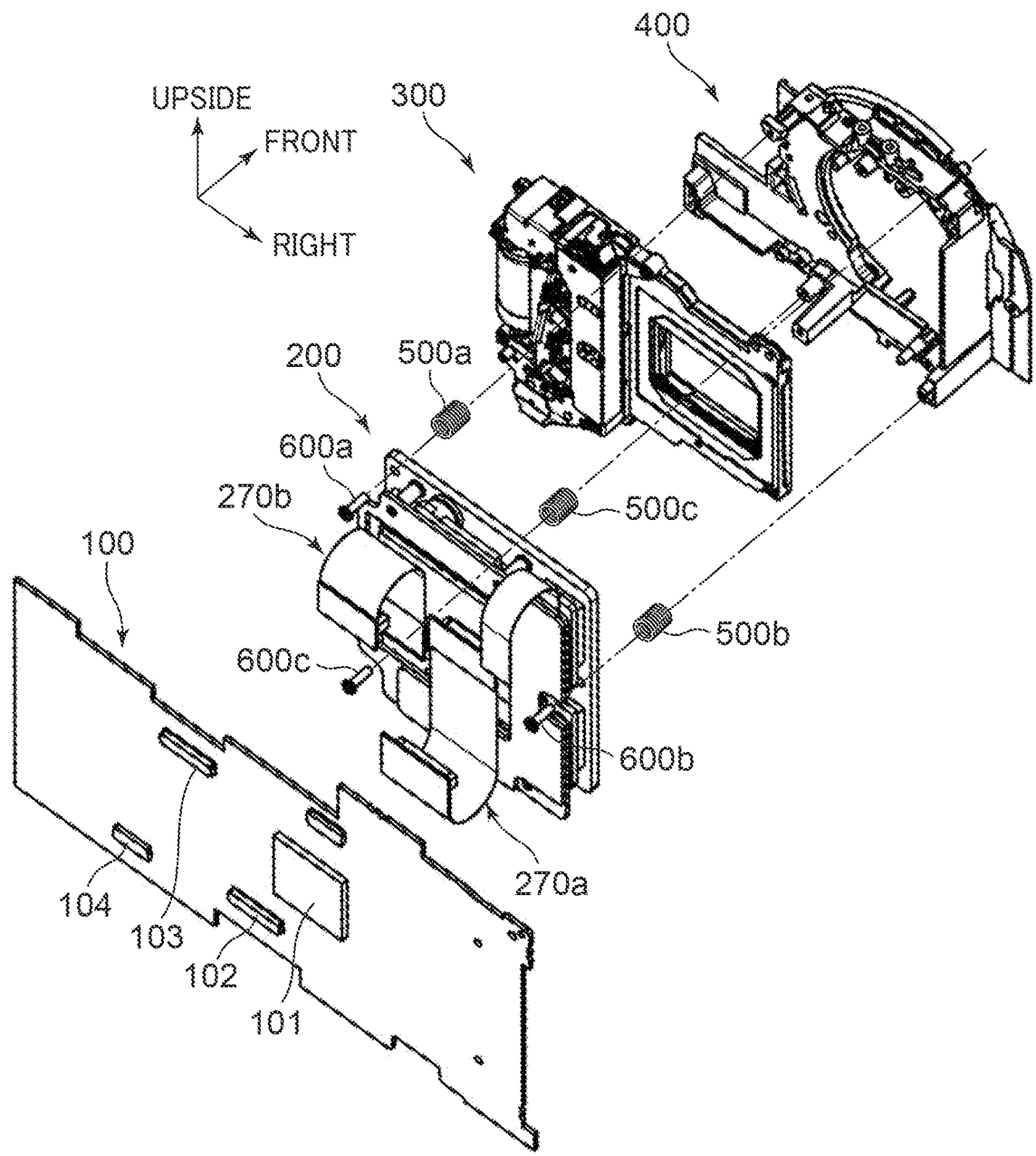
FIG. 2 is an exploded perspective view of essential parts of an image pickup apparatus as seen from behind (photographer side).

FIG. 2 is an exploded perspective view of essential parts of the image pickup apparatus 10 as seen from the rear (photographer side). The exterior 10c and others are not shown in FIG. 2. In FIG. 2 and the subsequent figures, to make understanding easier, component elements required for explanation of the present invention are illustrated, and component elements not required for explanation of the present invention are omitted to the extent possible.

The image pickup apparatus 10 has a control board 100 (control unit), an image blur correction unit 200, a shutter unit 300, and a base member 400. The image blur correction unit 200 as well as the shutter unit 300 is fixed to the base member 400. The base member 400 and the control board 100 are fixed to the exterior 10c. The image blur correction unit 200 is held by the base member 400 which the shutter unit 300 is mounted on and fixed to. Namely, the image blur correction unit 200 is supported on the base member 400 by three screws 600a, 600b, and 600c and three coil springs 500a, 500b, and 500c such that it can be displaced in a direction of the optical axis P (FIG. 1A). By adjusting the amount by which the screws 600a, 600b, and 600c are screwed, an operator can adjust the tilt of a light-incident surface of an image pickup device 230 (FIG. 3) with respect to the base member 400. After the adjustment is completed, the screws 600a, 600b, and 600c are adhered and fixed to a fixed unit 200b (supporting unit) of the image blur correction unit 200 so as to be prevented from loosening.

Connectors 102, 103, and 104 as well as a control IC 101, which controls image pickup signals, are mounted on the control board 100. In addition, various types of electronic components such as a chip resistance, a ceramic capacitor, an inductor, and a transistor (not shown) are mounted on the control board 100. A first flexible board 270a and a second flexible board 270b which are flexible printed circuit boards extended from the image blur correction unit 200 are connected to the connectors 102 and 103. Thus, the control board 100 and the image blur correction unit 200 are electrically connected together. The connector 104 electrically connects a flexible printed circuit board (not shown) extended from the shutter unit 300 and the shutter unit 300 together.

Figure 3:
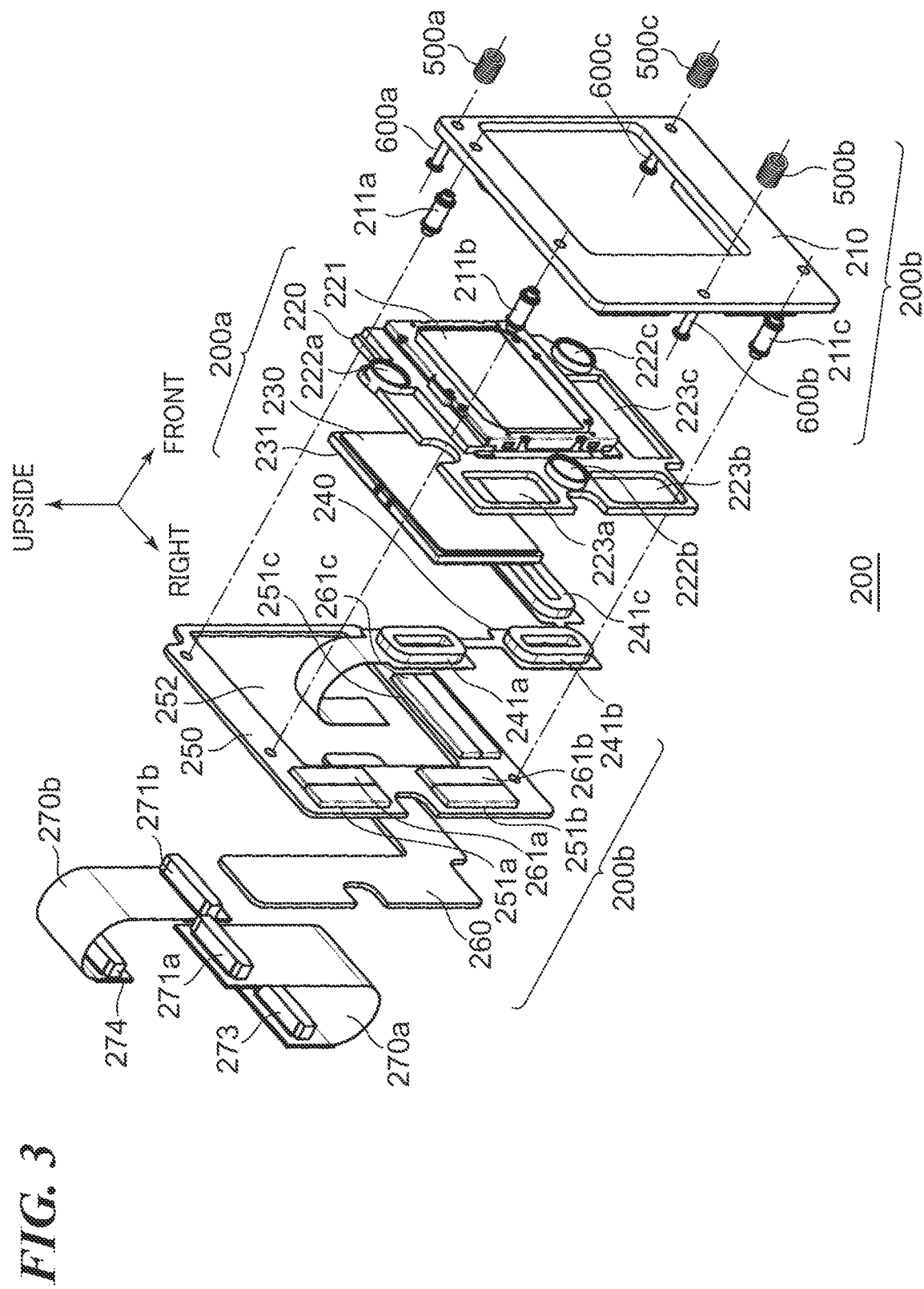
FIG. 3 is an exploded perspective view of an image blur correction unit.
Figure 4:
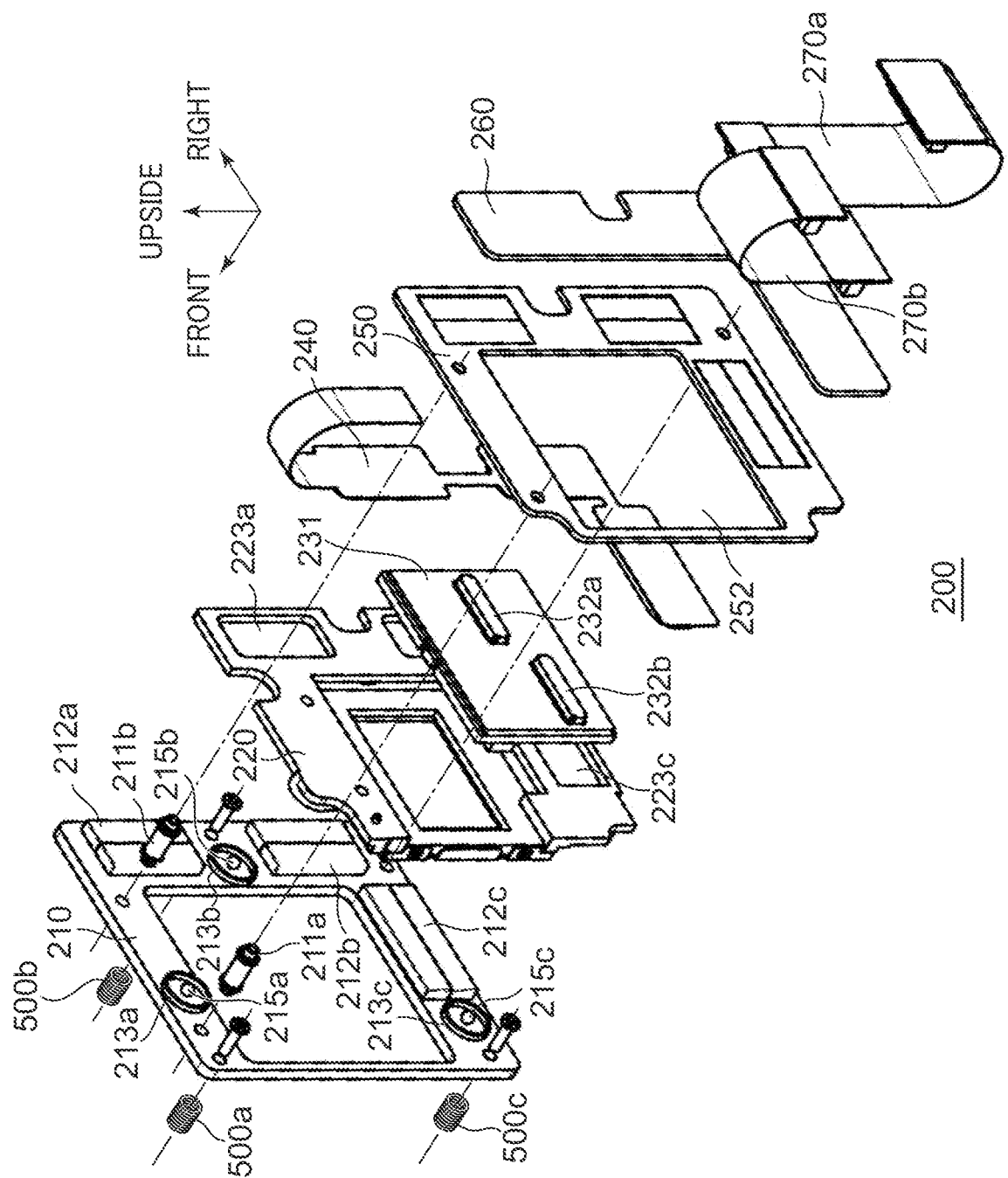
FIG. 4 is an exploded perspective view of the image blur correction unit.

FIGS. 3 and 4 are exploded perspective views of the image blur correction unit 200. The image blur correction unit 200 has a movable unit 200a and the fixed unit 200b. The movable unit 200a includes the image pickup device 230. The fixed unit 200b is fixed to the base member 400. The movable unit 200a is supported by the fixed unit 200b such that it can be displaced in a planar direction perpendicular to the optical axis P. Displacement of the movable unit 200a in the planar direction perpendicular to the optical axis P implements a function of optically correcting for image blurring.

The fixed unit 200b is comprised mainly of a front yoke 210, a base plate 250, and a rear yoke 260. The movable unit 200a is comprised mainly of a sensor holder 220 and a third flexible board 240. The first flexible board 270a and the second flexible board 270b connect the movable unit 200a and the control board 100 together. The third flexible board 240 connects the sensor holder 220 and the control board 100 together. All of the first flexible board 270a, the second flexible board 270b, and the third flexible board 240 are flexible printed circuit boards with flexibility.

The image pickup device 230 is mounted on an image pickup device board 231. The image pickup device 230 converts an optical image of a subject into an electric signal. The image pickup device 230 and the image pickup device board 231 are adhered and fixed to the sensor holder 220. In the sensor holder 220, a low-pass filter 221 is placed at the front of the image pickup device 230. The low-pass filter 221 prevents incidence of infrared rays and also prevents occurrence of, for example, color moiré. Three openings 223a, 223b, and 223c are formed in the sensor holder 220. The third flexible substrate 240 is equipped with three coils 241a, 241b, and 241c (FIG. 3). The third flexible substrate 240 is incorporated into to the sensor holder 220 from behind and adhered to and fixed to the sensor holder 220 such that the coils 241a, 241b, and 241c are fitted into the openings 223a, 223b, and 223c.

Three ball seats 222a, 222b, and 222c are formed in the sensor holder 220 (FIG. 3). In the front yoke 210, ball seats 213a, 213b, and 213c are formed at locations opposed to the ball seats 222a, 222b, and 222c (FIG. 4). The sensor holder 220, to which the image pickup device 230 and the image pickup device board 231 are adhered and fixed, and the front yoke 210 sandwich balls 215a, 215b, and 215c between the opposed ball seats. The balls 215a, 215b, and 215c are thus supported.

A magnet, not shown, is adhered to and fixed to the front yoke 210 at a location opposed to the sensor holder 220, and a sheet made of a ferromagnetic material (such as iron), not shown, is attached to the sensor holder 220 at a location opposed to the magnet. When the front yoke 210 and the sensor holder 220 are brought close to each other until the distance between them reaches a predetermined distance, the sensor holder 220 is magnetically attracted to the front yoke 210 and held by the front yoke 210 such that it can be displaced in a planar direction perpendicular to the optical axis P through the balls 215a, 215b, and 215c.

Magnets 212a, 212b, and 212c are attached to the front yoke 210 at locations opposed to the coils 241a, 241b, and 241c (FIG. 4). Supports 211a, 211b, and 211c are installed in a standing manner on the base plate 250. One end of each of the supports 211a, 211b, and 211c is press-fitted into the base plate 250. The front yoke 210 and the base plate 250 are joined together such that they sandwich the sensor holder 220.

Openings 251a, 251b, and 251c are formed in the base plate 250 at different locations as seen from the direction of the optical axis P, and magnets 261a, 261b, and 261c are fitted into the openings 251a, 251b, and 251c. As seen from the direction of the optical axis P, the magnets 261a, 261b, and 261c are formed at substantially the same locations and have the same shapes as the corresponding coils 241a, 241b, and 241c. Moreover, the magnets 261a, 261b, and 261c are placed at such positions that their centers match those of the corresponding coils 241a, 241b, and 241c.

The operator mounts the rear yoke 260 on the base plate 250 from behind such that the magnets 261a, 261b, and 261c are fitted into the openings 251a, 251b, and 251c. The rear yoke 260 and the base plate 250 are each made of a ferromagnetic material. The operator can magnetically attracts the rear yoke 260 and the base plate 250 to each other only by aligning the rear yoke 260, to which the magnets 261a, 261b, and 261c are attached, with the base plate 250 and bringing them into contact with each other. The operator thus can join these two components together without using any additional adhesive material.

An opening 252 is also formed in the base plate 250. When the sensor holder 220 is sandwiched between the front yoke 210 and the base plate 250, the image pickup device board 231 exposes itself rearward from the opening 252. Connectors 232a and 232b are mounted on the image pickup device board 231 (FIG. 4). A connector 271a is mounted on the first flexible board 270a, and a connector 271b is mounted on the second flexible board 270a (FIG. 3). The operator incorporates these first and second flexible board 270a and 270b into the image pickup device board 231 through the opening 252 from behind to fit the connector 232a and the connector 271a on each other and also fit the connector 232b and the connector 271b on each other. The connectors 232a and 232b and the connectors 271a and 271b have the same relationship as the relationship between a plug connector and a receptacle connector which have shapes to fit with each other.

Each of the first and second flexible board 270a and 270b has a long plate-like shape, and the connectors 271a and 271b are mounted on ends of the respective first and second flexible board 270a and 270b. Connectors 273 and 274 are mounted on the other ends of the first and second flexible board 270a and 270b in their wiring direction (longitudinal direction). The connector 273 has the same relationship with the connector 102 (FIG. 2), which is mounted on the control board 100, as the relationship between a plug connector and a receptacle connector which have shapes to fit with each other. Likewise, the connector 274 has the same relationship with the connector 103 (FIG. 2), which is mounted on the control board 100, as the relationship between a plug connector and a receptacle connector which have shapes to fit with each other.

Figure 5:
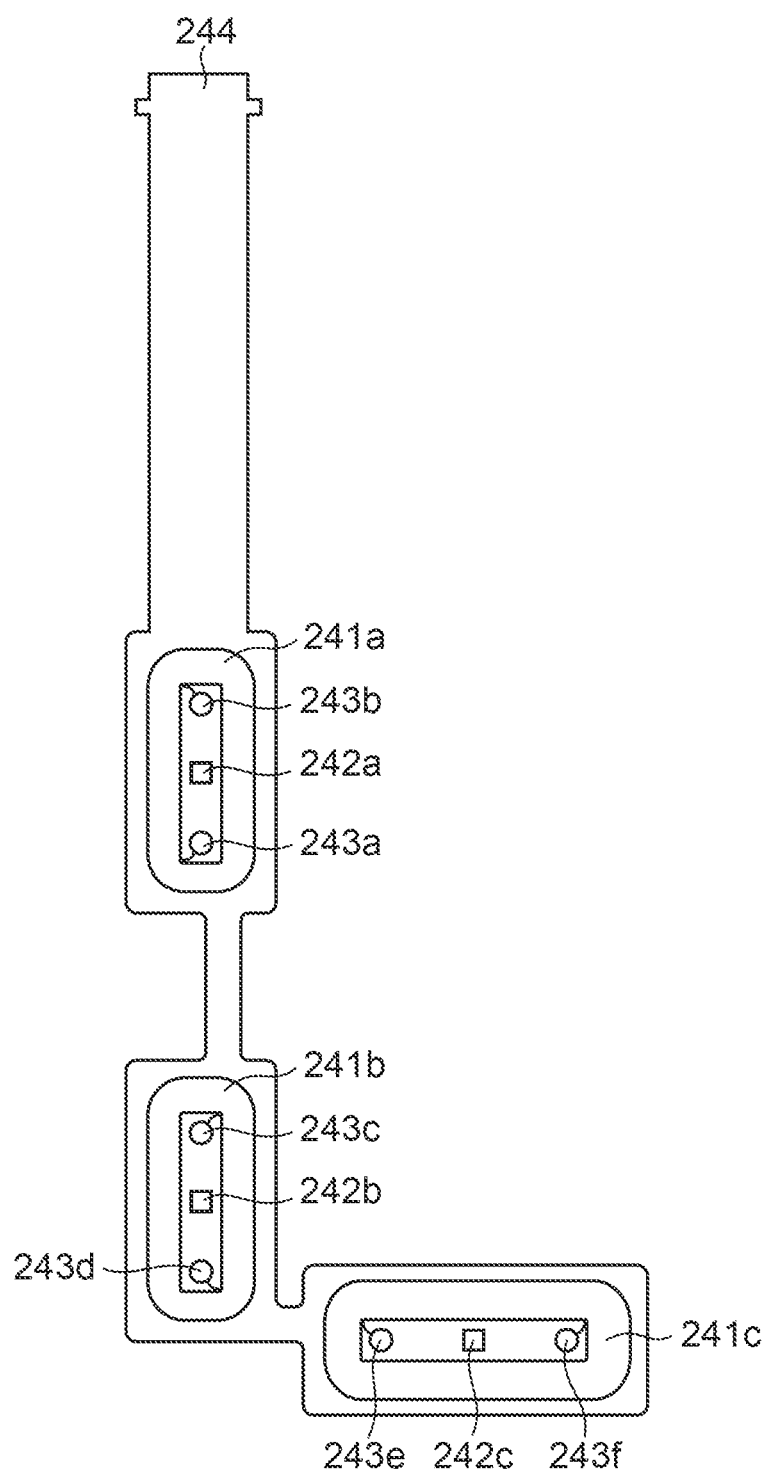
FIG. 5 is a front view showing an arrangement of a third flexible board.

FIG. 5 is a front view of the third flexible board 240. As described above, the coils 241a, 241b, and 241c are adhered and fixed to the third flexible board 240. Soldering lands 243a, 243b, 243c, 243d, 243e, and 243f for electrically connecting with coil windings are formed on the third flexible board 240. The operator solders a winding beginning and a winding end of the coil 241a to the soldering lands 243a and 243b. Likewise, the operator solders a winding beginning and a winding end of the coil 241b to the soldering lands 243c and 243d and also solders a winding beginning and a winding end of the coil 241c to the soldering lands 243e and 243f. As a result of the soldering, each coil is electrically connected to the third flexible board 240.

On the third flexible board 240, Hall effect devices 242a, 242b, and 242c are mounted inside the windings of the coils 241a, 241b, and 241c. The third flexible board 240 has a connecter terminal portion 244. Wiring patterns from the soldering lands and the Hall effect devices are laid out inside the third flexible board 240 and connected to a connector terminal portion, not shown. The connector terminal portion 244 is electrically connected to the connectors mounted on the control board 100.

The coils 241a, 241b, and 241c is thus placed in a magnetic field environment formed by the magnets 212a, 212b, and 212c placed on the front yoke 210 and the magnets 261a, 261b, and 261c placed on the rear yoke 260. By passing electric current through these coils, Lorentz force is generated in each coil, which acts as thrust force causing the sensor holder 220 to be displaced in the planar direction perpendicular to the optical axis P. The Hall effect devices 242a, 242b, and 242c mounted inside the coils 241a, 241b, and 241c detect changes in magnetic force caused by movement of the sensor holder 220 relative to the magnets 212a, 212b, and 212c. Based on the detection results, the amount of displacement of the movable unit 200a with respect to the fixed unit 200b in the planar direction perpendicular to the optical axis P is detected.

A detailed description will now be given of arrangements of the first and second flexible boards 270a and 270b. For the sake of convenience, according to the above definitions of the directions, the coil 241c is located to the lower left of the image pickup device 230, and the coil 241a is located to the upper right of the image pickup device 230. On the control board 100 (FIG. 2), the connectors 102 and 104 are mounted in a lower part, and the connector 103 is mounted in an upper part. The connectors 102, 103, and 104 are mounted on a rear face of the control board 100. The connectors 232a and 232b are mounted on a rear face of the image pickup device board 231.

To correct for image blurring in a pitch direction which is a direction of rotation around the side-to-side axis, the movable unit 200a makes translational movements in a vertical direction. To correct for image blurring in a yaw direction which is a direction of rotation around the vertical axis, the movable unit 200a makes translational movements in a horizontal direction (predetermined direction). To correct for image blur in a roll direction which is a direction of rotation around the front-to-back axis, the movable unit 200a rotates around an axis parallel to a front-back direction.

Figure 6:
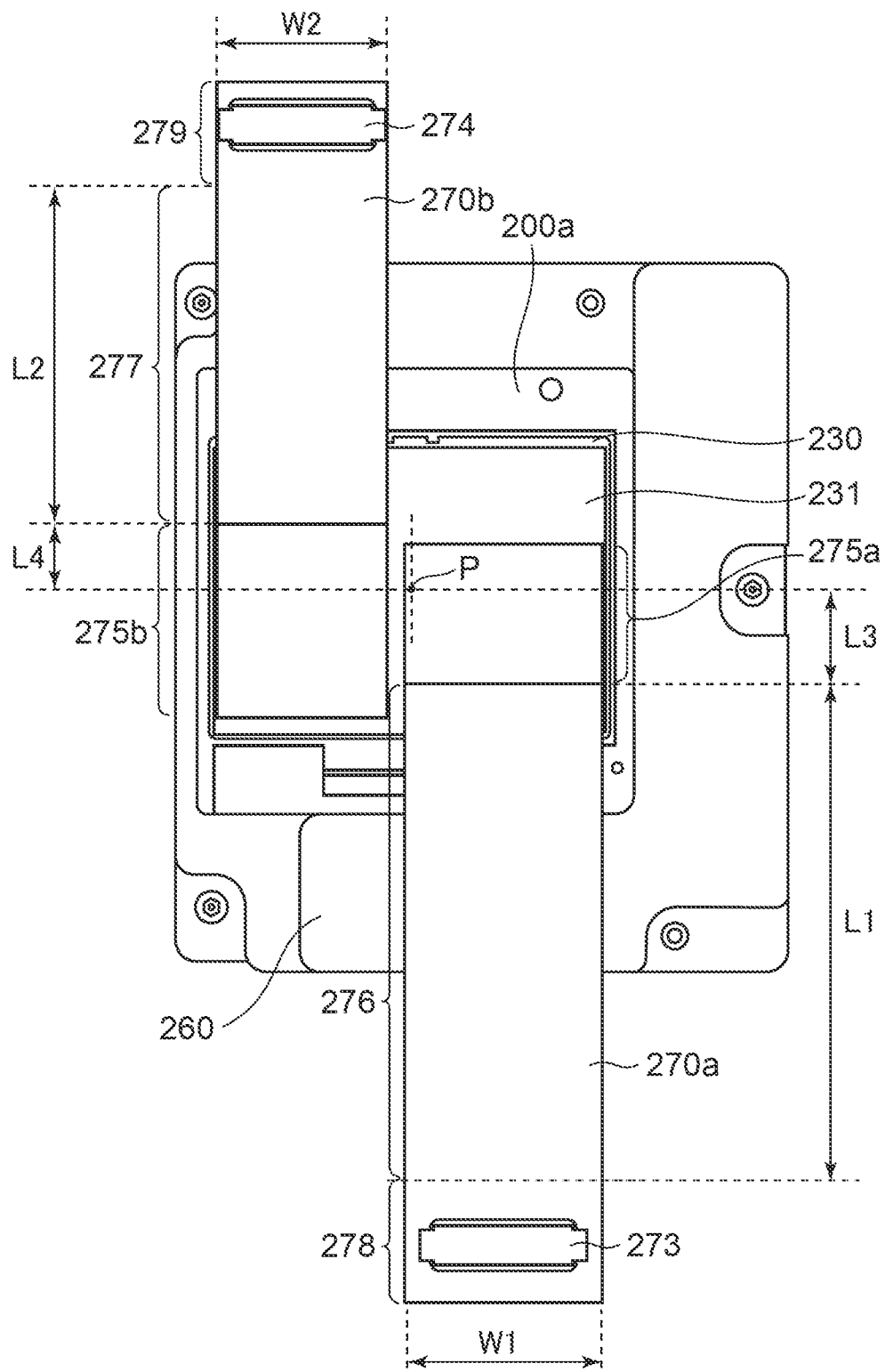
FIG. 6 is a rear view of a movable unit to which first and second flexible boards are fixed.
Figure 7:
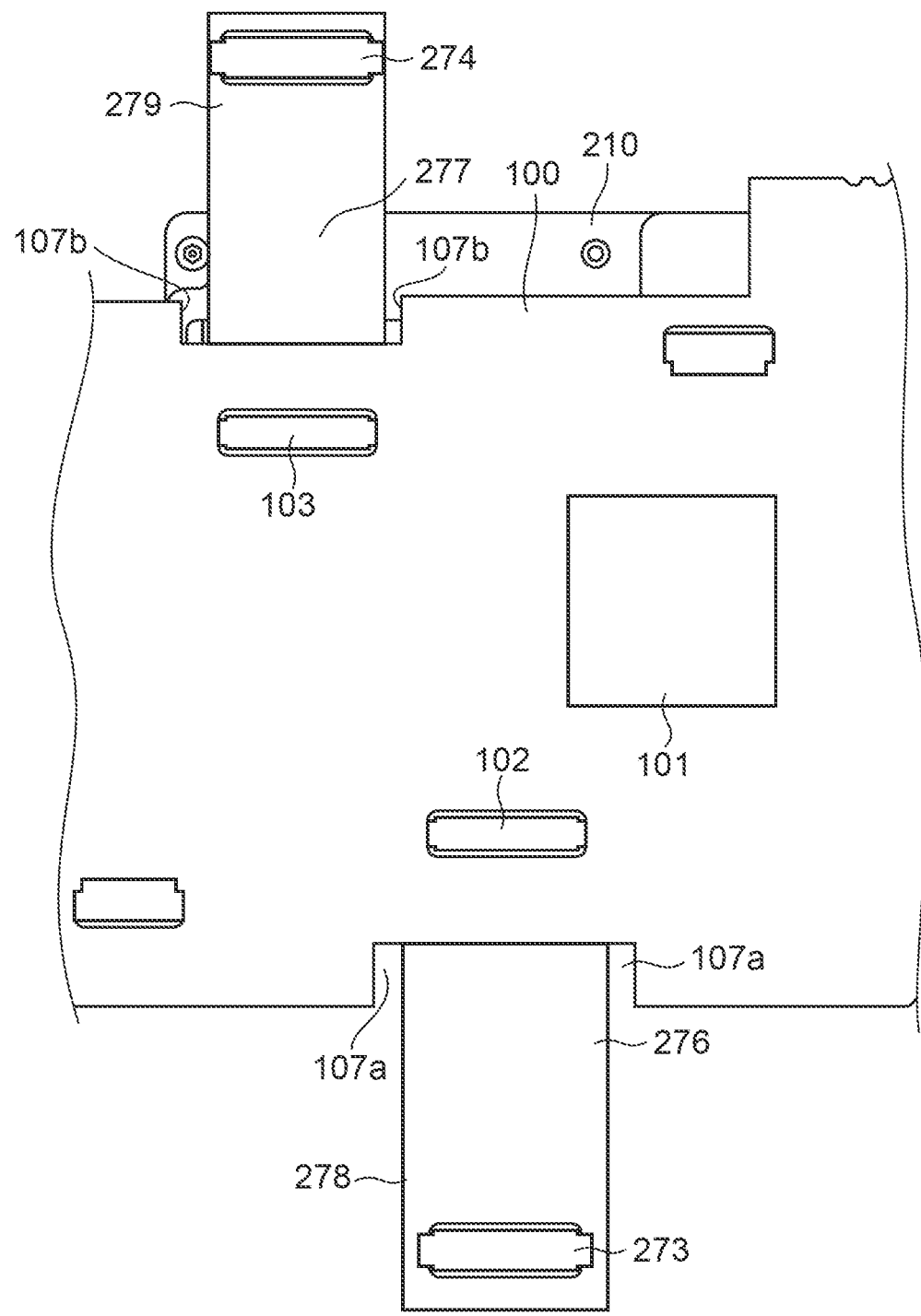
FIG. 7 is a view of a state in which the movable unit is mounted on a control board as seen from behind.
Figure 8:
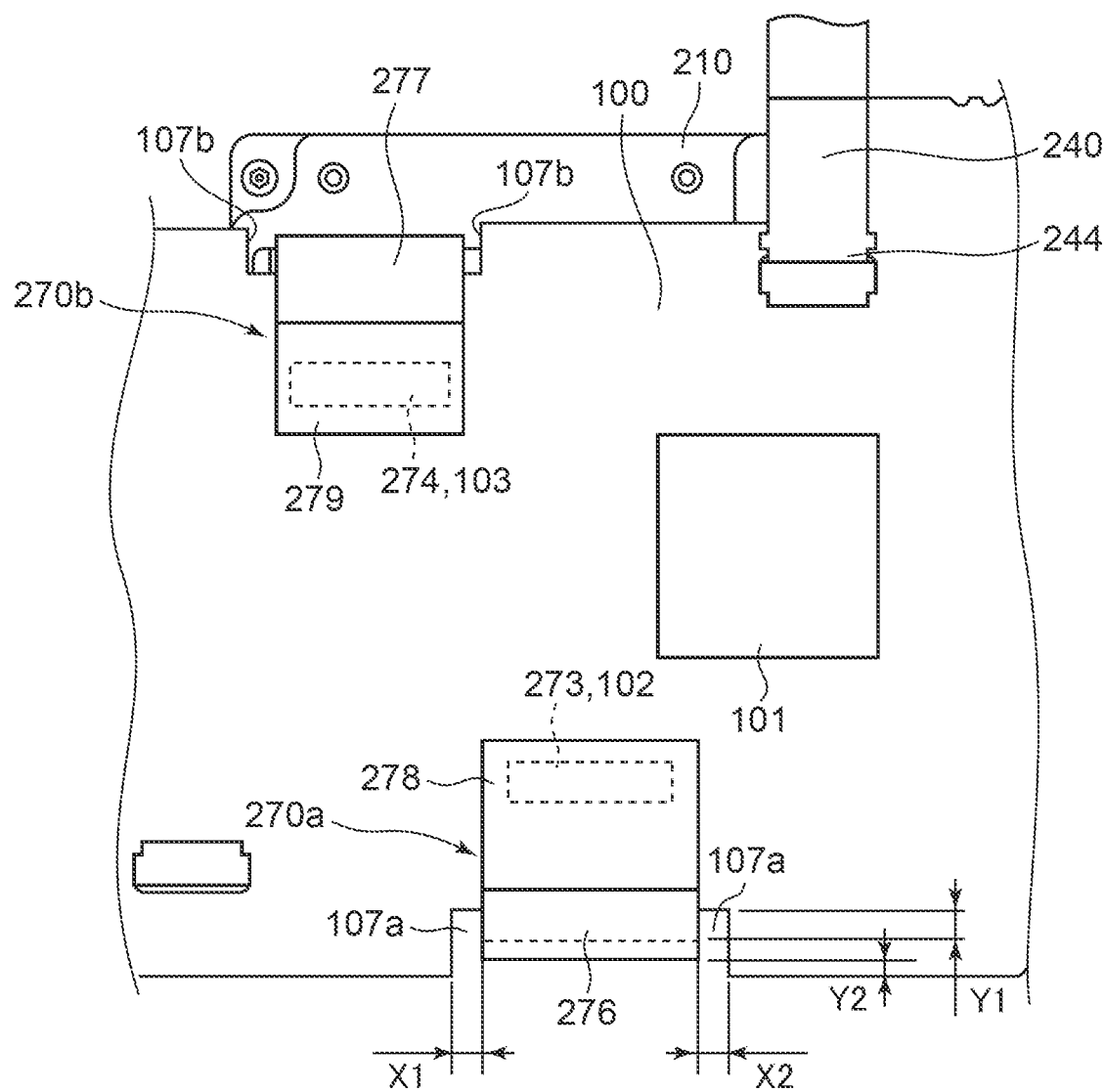
FIG. 8 is a view of a state in which the movable unit is mounted on the control board as seen from behind.
Figure 9:
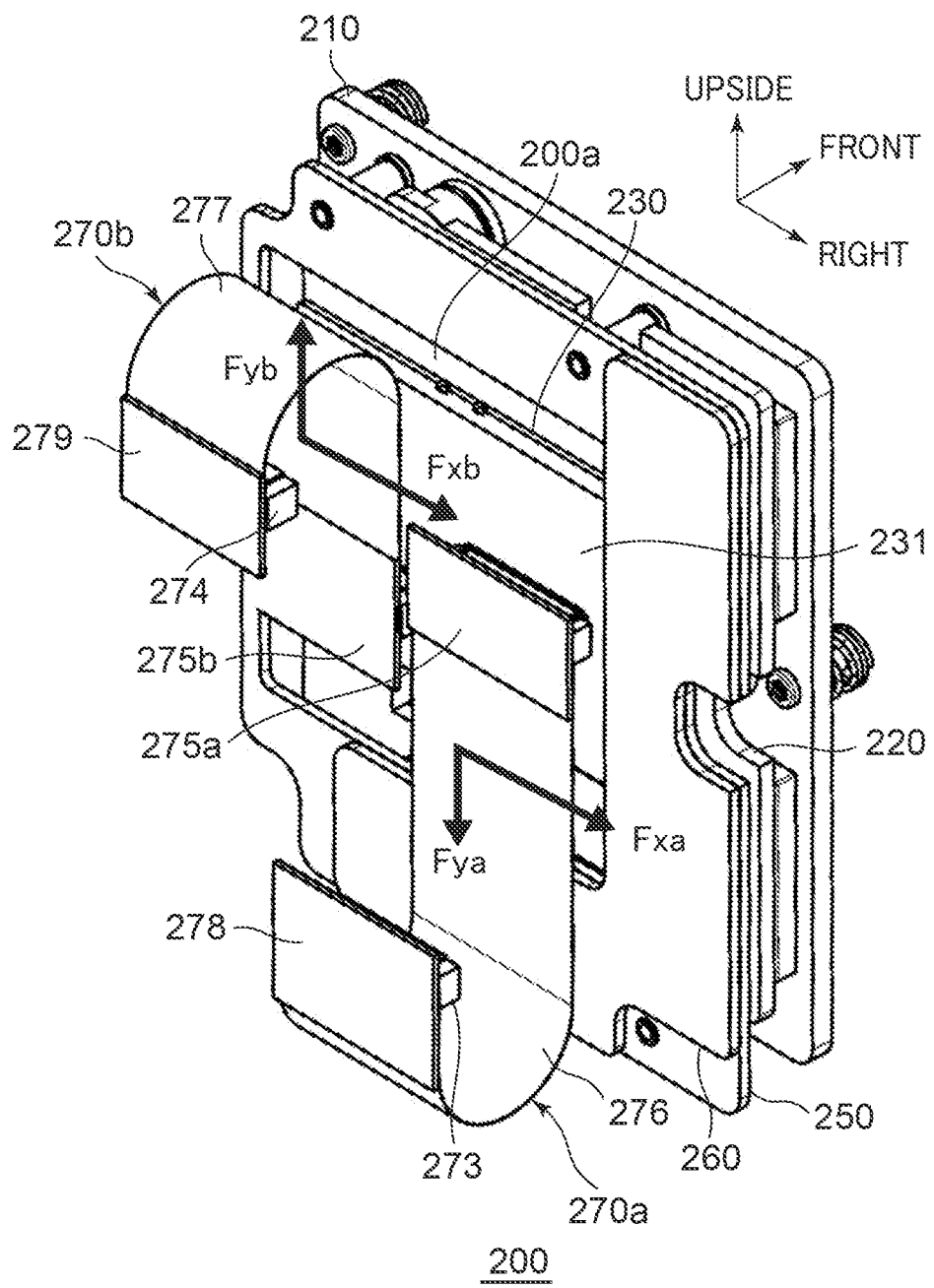
FIG. 9 is a perspective view of the image blur correction unit.

A description will now be given of the arrangements of the first and second flexible boards 270a and 270b with reference to FIGS. 6 to 9. FIG. 6 is a rear view of the movable unit 200a to which the first and second flexible boards 270a and 270b are fixed. FIGS. 7 and 8 are views of a state in which the movable unit 200a is mounted on the control board 100 as seen from behind. In particular, FIG. 7 shows a state where the connectors 273 and 274 on the first and second flexible boards 270a and 270b are not connected to the connectors 102 and 103 on the control board 100, and FIG. 8 shows a state where the connectors 273 and 274 are connected to the connectors 102 and 103. FIG. 9 is a perspective view of the image blur correction unit 200.

Connection of the connectors 271a and 271b (FIG. 3) and the connectors 232a and 232b (FIG. 4) to each other causes the first and second flexible boards 270*a* and 270*b* to be electrically connected to the image pickup device board 231 and also causes the connectors 271*a* and 271*b* to be fixed to the movable unit 200*a*.

The first and second flexible boards 270*a* and 270*b* are each roughly divided into three regions, that is, two rigid bodies (connecting portions) and a flexible part (portion) that connect the rigid bodies together. The rigid bodies (connecting portions) are made rigid by attaching an insulation reinforcing material such as a glass epoxy resin to the flexible part (wiring portion) with a thermosetting adhesive, and connectors are mounted on a surface of the flexible part (wiring portion).

As shown in FIG. 6, the first flexible board 270*a* has a first connecting portion 275*a*, a first wiring portion 276, and a second connecting portion 278 in order from the one closest to the connector 271*a* (FIG. 3) in a wiring direction (longitudinal direction). The first wiring portion 276 is extended from the first connecting portion 275*a* in a downward direction (first direction). The connector 271*a* is placed in the first connecting portion 275*a*, and the connector 271*b* is placed in the second connecting portion 278*a*.

The second flexible board 270*b* has a third connecting portion 275*b*, a second wiring portion 277, and a fourth connecting portion 279 in order from the one closest to the connector 271*b* (FIG. 3) in a wiring direction (longitudinal direction). The second wiring portion 277 is extended from the third connecting portion 275*b* in an upward direction (second direction) opposite to the downward direction (first direction). The connector 271*b* is placed in the third connecting portion 275*b*, and the connector 271*b* is placed in the fourth connecting portion 279.

The first connecting portion 275*a*, the third connecting portion 275*b*, the second connecting portion 278, and the fourth connecting portion 279 are made rigid by attaching an insulation reinforcing material such as a glass epoxy resin to the flexible part (wiring portion) with a thermosetting adhesive. The board-to-board connectors (the connectors 271*a*, 271*b*, 273, and 274) are mounted on a surface opposite to the surfaces of the above connecting portions to which the reinforcing material is attached.

As shown in FIG. 6, in the wiring direction of the first flexible board 270*a*, the first wiring portion 276 is placed in a region between the first connecting portion 275*a* and the second connecting portion 278. The first wiring portion 276 has flexibility and electrically connects the connectors 271*a* and 273 together. In the wiring direction of the second flexible board 270*b*, the second wiring portion 277 is placed in a region between the third connecting portion 275*b* and the fourth connecting portion 279. The second wiring portion 277 has flexibility and electrically connects the connectors 271*b* and 274 together.

As shown in FIG. 8, a first cut 107*a* is formed on a lower side (an edge in the first direction) of the control board 100. A second cut 107*b* is formed on an upper side (an edge in the second direction) of the control board 100. The first wiring portion 276 of the first flexible board 270*a* is wired through the first cut 107*a*, and the second wiring portion 277 of the second flexible board 270*b* is wired through the second cut 107*b*. Namely, the first wiring portion 276 is extended downward from the first connecting portion 275*a* and then curved rearward to pass through the first cut 107*a* and extended upward. The connector 273 is then fitted into the connector 102. On the other hand, the second wiring portion 277 is extended upward from the third connecting portion 275*b* and then curved rearward to pass through the second cut 107*b* and extended downward. The connector 274 is then fitted into the connector 103.

The second wiring portion 277 and the first wiring portion 276 are configured to be wired in such a manner to surround a part of an upper and lower part of the control board 100. The second wiring portion 277 and the first wiring portion 276 are routed in two routes i.e. upper and lower routes which are pitch directions of image blur vibrations, that is, translational directions of the movable unit 200*a*. By routing the second wiring portion 277 and the first wiring portion 276 in those directions, loads arising from deformation of the first and second flexible boards 270*a* and 270*b* can be made substantially uniform when the movable unit 200*a* is moved rightward and when the movable unit 200*a* is moved leftward. A description thereof will now be given in comparison with a comparative example (FIG. 16).

Figure 16:
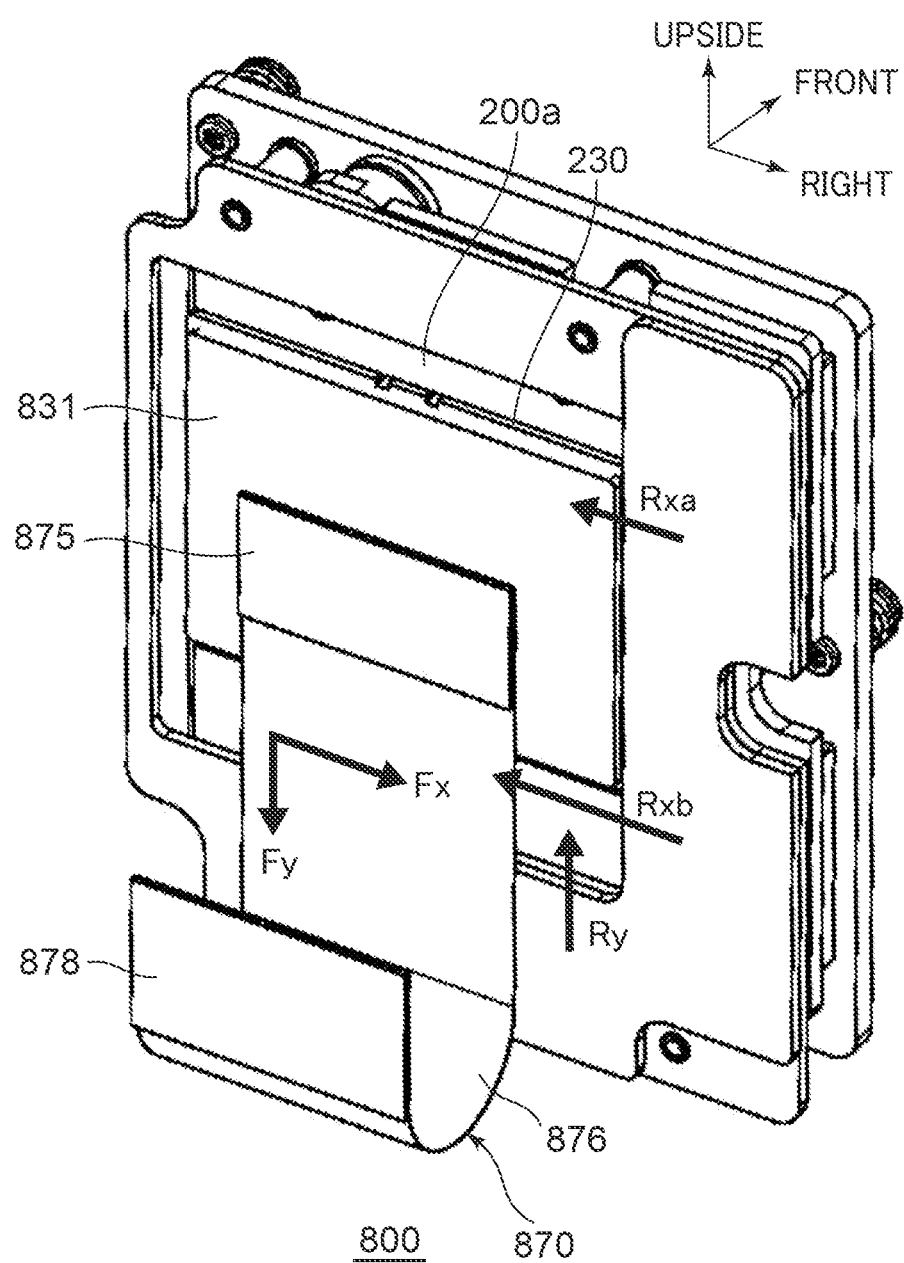
FIG. 16 is a perspective view of an image blur correction unit in a comparative example.

FIG. 16 is a perspective view of an image blur correction unit 800 in the comparative example. As compared to the image blur correction unit 200 (FIG. 9), the image blur correction unit 800 has one flexible board 870 in place of the first and second flexible boards 270*a* and 270*b* and has an image pickup device board 831 in place of the image pickup device board 231. The flexible board 870 corresponds to a combination of the first and second flexible boards 270*a* and 270*b*. The flexible board 870 has a connecting portion 875, a wiring portion 876, and a connecting portion 878. Connectors which are to be connected to connectors (corresponding to the connectors 232*a*, 232*b*) of the image pickup device board 831 are mounted on the connecting portion 875, and connectors which are to be connected to connectors (corresponding to the connectors 102, 103) of the control board 100 are mounted on the connecting portion 878. In the image blur correction unit 200 (FIG. 9), the first wiring portion 276 and the second wiring portion 277 are extended upward and downward in directions opposite to each other. On the other hand, in the comparative example, the wiring portion 876 of the flexible board 870 is extended downward in only one direction from a connector connected to the image pickup device board 831.

A description will now be given of loads arising from deformation of the flexible boards and how the movable unit 200*a* is controlled. Assume that the movable unit 200*a* is moved leftward. In the present embodiment, when the movable unit 200*a* is moved leftward, rightward forces Fax and Fxb are generated as reaction forces generated by the first and second flexible boards 270*a* and 270*b*, respectively. As for a vertical direction, an upward force Fya is generated as a reaction force of the flexible board 270*a*, and a downward force Fyb is generated as a reaction force of the flexible board 270*b*.

The first and second flexible boards 270*a* and 270*b*, however, are separately routed in the two routes in the upper and lower directions, and hence the magnitudes of the forces Fya and the force Fyb are substantially equal. It is thus possible to balance the loads in the vertical direction. Therefore, the loads on the first and second flexible boards 270*a* and 270*b* are substantially generated only in a rightward direction, and their magnitude is the sum of the forces Fxa and Fxb. The load in the vertical direction is approximately zero, and hence the movable unit 200*a* can easily be controlled because it needs to be drivingly controlled only in the horizontal direction.

On the other hand, in the comparative example (FIG. 16), when the movable unit 200*a* is moved leftward, a rightward force Fx is generated as a reaction force generated by the flexible board 870. A force Fy is generated in a downward direction. Since the wiring portion 876 is routed in only one direction, a resultant of the force Fx and the force Fy acts on the movable unit 200a. Thus, it is necessary to drivingly control the movement of the movable unit 200a not only in the horizontal direction but also in the vertical direction, and hence it is complicated to control the movement of the movable unit 200a. Specifically, it is necessary to generate an upward thrust Ry, which is for canceling out the reaction force of the flexible board 870, by passing electric current through the coil 241c of the movable unit 200a to generate a Lorenz force in the coil 241c.

The movable unit 200a is subjected to the force Fx of the flexible board 870 at a lower position away from the optical axis P, and hence a rotational moment around an axis parallel to the optical axis P acts on the movable unit 200a. It is thus necessary to prevent rotation of the movable unit 200a by making Lorenz forces generated in the coils 241a and 241b different to control the magnitudes of thrusts Rxa and Rxb. Controlling the movement of the movable unit 200a may become complicated in this respect as well.

Moreover, according to the comparative example, magnets and coils required to control the movable unit 200 with high accuracy would increase, leading to upsizing of the image pickup apparatus 10 and increasing power consumption necessary for controlling. In the present embodiment, the first and second flexible boards 270a and 270b are routed in the two opposite routes, and this contributes to downsizing of the image pickup apparatus 10 and reduction of power consumption.

As shown in FIG. 6, it is assumed that in the wiring direction of the first flexible board 270a, a length from a boundary between the first wiring portion 276 and the first connecting portion 275a to a boundary between the first wiring portion 276 and the second connecting portion 278 is a length L1 of the first wiring portion 276. It is assumed that in the wiring direction of the second flexible board 270b, a length from a boundary between the second wiring portion 277 and the third connecting portion 275b to a boundary between the second wiring portion 277 and the fourth connecting portion 279 is a length L2 of the second wiring portion 277. In the vertical direction, a length from the optical axis P to the boundary between the first connecting portion 275 and the first wiring portion 276 is denoted by L3, and a length from the optical axis P to the boundary between the third connecting portion 275b and the second wiring portion 277 is designated by L4. In the horizontal direction, a width of the first wiring portion 276 is designated by W1, and a width of the second wiring portion 277 is designated by W2.

To make the loads arising from the deformation of the first and second flexible boards 270a and 270b more uniform, it is preferred that the length L1 and the length L2 are substantially equal, and the length L3 and the length L4 are substantially equal. It is also preferred that the width W1 and the width W2 are substantially equal. It is preferred that at least the first wiring portion 276 of the first flexible boards 270a and the second wiring portion 277 of the second flexible boards 270b have substantially the same length and width. This makes the loads arising from the deformation of the first and second flexible boards 270a and 270b more uniform and further contributes to downsizing of the image pickup apparatus 10 and reduction of power consumption.

FIG. 8 is a view of an initial state in which the movable unit 200a has not been displaced. In this initial state, as for spaces between the first wiring portion 276 and the first cut 107a in the horizontal direction, the left-side space is designated by X1, and the right-side space is designated by X2. Namely, the cut width of the first cut 107a in the horizontal direction is represented by the following expression, the width of the first wiring portion 276+X1+X2. On the other hand, a space between a location of the first cut 107a in a depth direction and a lowermost end of a curved inner surface of the first wiring portion 276 is designated by Y1. A space between a lower end position of an outermost dimension of the control board 100 and a lower end position of the first cut 107a is designated by Y2.

The spaces X1, X2, and Y1 are set such that even in a case where the movable unit 200a is displaced to the greatest extent possible with respect to the fixed unit 200b, the first wiring portion 276 does not contact right and left edges and an upper edge of the first cut 107a. The space Y2 is set such that even in a case where the movable unit 200a is displaced to the greatest extent possible with respect to the fixed unit 200b, the first wiring portion 276 does not protrude from the first cut 107a and therefore fits into the outermost dimension of the control board 100.

First, to correct for image blurring in the yaw direction, the movable unit 200a makes a translational movement in the horizontal direction. The space X1 is set at a greater value than a maximum amount of leftward translational movement of the movable unit 200a from a state where the center of the movable unit 200a corresponds to the optical axis P (initial state). The space X2 is set at a greater value than a maximum amount of rightward translational movement of the movable unit 200a from the initial state. To correct for image blurring in the pitch direction, the movable unit 200a makes a translational movement in the vertical direction. The space Y1 is set at a greater value than a maximum amount of upward translational movement of the movable unit 200a from the initial state. The space Y2 is set at a greater value than a maximum amount of downward translational movement of the movable unit 200a from the initial state.

The positional relationship between the second cut 107b and the second wiring portion 277 is determined in the same manner as the positional relationship between the first cut 107a and the first wiring portion 276. Thus, even in a case where the movable unit 200a is displaced to the greatest extent possible with respect to the fixed unit 200b, the second wiring portion 277 does not contact right and left edges and an upper edge of the second cut 107b. Also, even in a case where the movable unit 200a is displaced to the greatest extent possible with respect to the fixed unit 200b, the second wiring portion 277 does not protrude from the second cut 107b and therefore fits into the outermost dimension of the control board 100.

Figure 10:
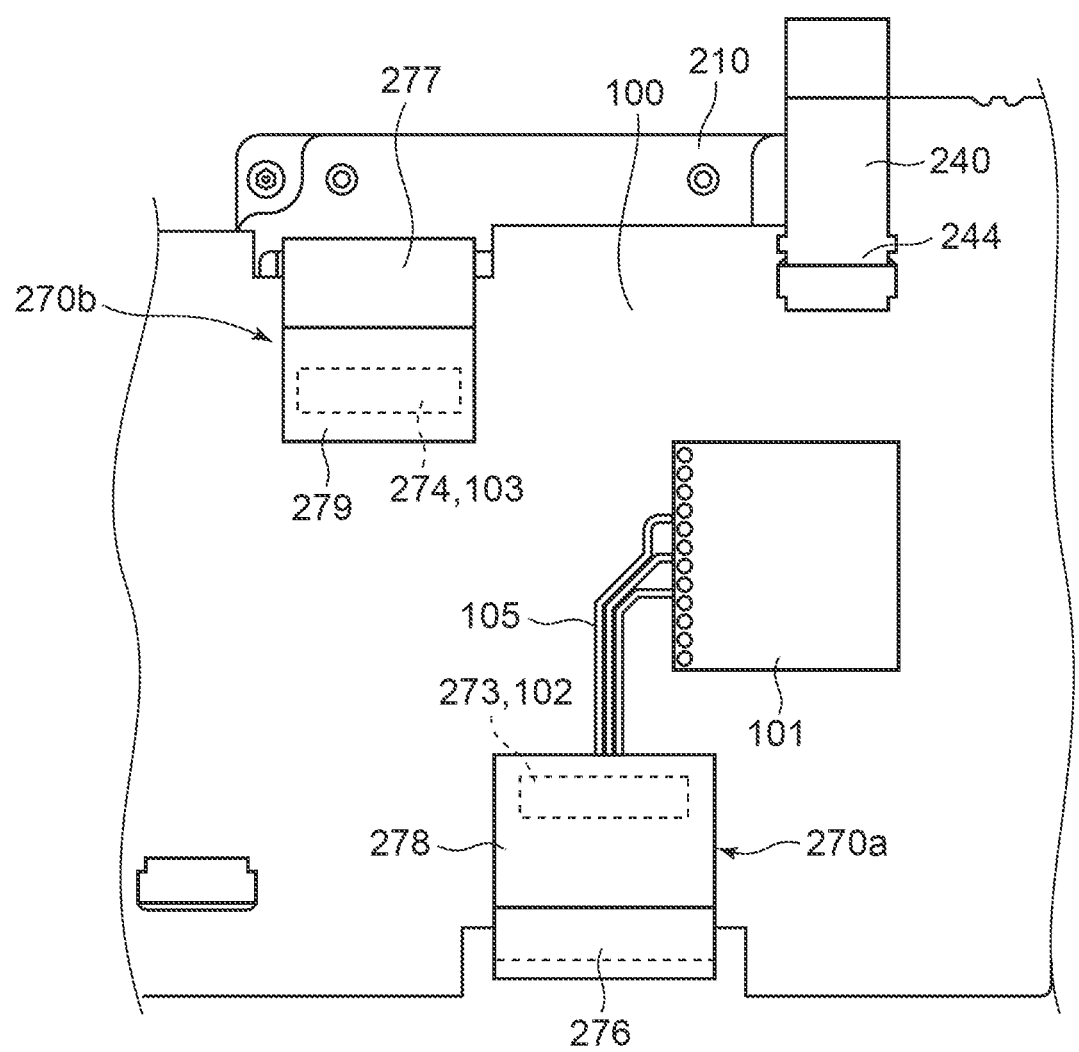
FIG. 10 is a front view showing a wiring pattern laid out inside the control board.

Next, referring to FIGS. 6 to 10, a description will be given of wiring patterns laid out inside the image pickup apparatus 10. FIG. 10 is a front view showing a wiring pattern laid out inside the control board 100.

On the first flexible board 270a, high speed transmission wiring is formed to electrically connect the connector 271a (FIG. 3) to the connector 273 (FIG. 6) via the first wiring portion 276. The high speed transmission wiring is a pair of two signal lines using a transmission method such as LVDS (Low Voltage Differential Signaling). The image pickup apparatus 10 uses this high speed transmission wiring for transmission of image pickup signals between the image pickup device 230 and the control board 100 to support high speed transmission of image pickup signals. On the first flexible board 270a, ground wiring, wiring required for the image pickup device 230, and so forth as well as the high speed transmission wiring are installed.

On the second flexible board 270b, power source wiring is formed to electrically connect the connector 271b (FIG. 3) to the connector 274 (FIG. 6) via the second wiring portion 277. On the second flexible board 270b, ground wiring, wiring required for the image pickup device 230, and so forth as well as the high speed transmission wiring are installed. In the present embodiment, differential transmission wiring is adopted as the high speed transmission wiring installed in the first wiring portion 276. As with the connectors 271a and 271b, the connectors 273 and 274 are configured to have two lines of signal terminals parallel to each other.

The first and second flexible boards 270a and 270b have a multilayered structure, and in the present embodiment, they have a two-layer structure. The connectors 273 and 274 are mounted on the surfaces of the first and second flexible boards 270a and 270b which are opposite to the surfaces on which the connectors 271a and 271b are mounted. The high speed transmission wiring is extended from the signal terminal lines of the connector 271a and electrically connected to one of the two parallel signal terminal lines of the connector 273, which is placed on a rear side as seen from the connector 271a. Specifically, the high speed transmission wiring is passed through the rear side of the surface on which the connector 273 is mounted, then electrically connected to a transmission path wired on the surface on which the connector 273 is mounted via through holes, and connected to the signal terminals placed in the terminal line on the rear side as seen from the connector 271a.

As shown in FIG. 10, the control IC 101 which forms a rectangular package outer shape is mounted on the upper right of the connector 102 mounted on the control board 100. A plurality of signal terminals is formed on the control IC 101, and these signal terminals are joined to the control board 100 by soldering and electrically connected to the control board 100. The control IC 101 is a circuit to which image pickup signals output from the image pickup device 230 are transmitted. Three pairs of differential transmission wiring are installed as high-speed transmission wiring 105 electrically connected from the connector 102 to a part of the signal terminals of the control IC 101. The high-speed transmission wiring 105 is electrically connected to the high-speed transmission wiring installed inside the first flexible board 270a via the connectors 273 and 102. The high-speed transmission wiring 105 forms the same differential transmission path as the high-speed transmission wiring installed in the first flexible board 270a. A variety of signal wiring and ground wiring as well as the high-speed transmission wiring 105 are installed on the control board 100, but they are omitted from FIG. 10.

In general, when a plurality of electric signals that requires synchronization is transmitted on a high-speed transmission path, isometric wiring with wires of equal lengths on which the plurality of electric signals is transmitted is preferred so as to make a difference in delay time caused by wiring satisfactorily small. It is also preferred that signal lines are designed to be as short as possible so as not to be affected by noise or the like. To shorten the route from the image blur correction unit 200 to the control IC 101 mounted on the control board 100, it is preferred that the connector 102 of the control board 100 and the control IC 101 are placed as close as possible to each other. The control IC 101 may be placed on the right side or left side of the connector 102 of the control board 100, and this can further reduce the wiring length of the high-speed transmission wiring.

Moreover, on a high-speed transmission path, electromagnetic field noise may be produced from high-speed transmission wiring. Since the high-speed transmission wiring is installed in the first flexible board 270a, electromagnetic field noise is produced mainly from the connector 271a mounted on the first connecting portion 275a and the connector 273 mounted on the second connecting portion 278. When the electromagnetic field noise is produced, the electromagnetic field noise may propagate into the image pickup apparatus 10 to affect the wireless antenna 10b (FIG. 1A, FIG. 1B) built in the image pickup apparatus 10 and decrease wireless performance.

As described above, the wireless antenna 10b is placed at the left end of the upper part of the image pickup apparatus 10 and close to the exterior 10c. In the present embodiment, the first flexible board 270a on which much more electromagnetic field noise is produced than on the second flexible board 270b is placed on the side (the right side) far from the location at which the wireless antenna 10b is placed. Namely, the location at which the connector 102 is placed is away from the wireless antenna 10b. Moreover, as for the first flexible board 270a, the first wiring portion 276 is extended to the lower side of the control board 100 and also curved rearward so that the connector 273 can be connected to the connector 102. This reduces the effects on the wireless antenna 10b.

It should be noted that in a case where it is difficult to compare the locations of the first and second flexible boards 270a and 270b when considering the distance from the wireless antenna 10b, their positions of the center of gravity may be compared with each other. Alternatively, in a case where the distance from the wireless antenna 10b is considered on the assumption that much more electromagnetic field noise is produced on the first flexible board 270a than on the second flexible board 270b, at least one of the following conditions may be adopted as a condition that should be satisfied in an assembled state. The conditions include the condition that "the connector 273 is farther away from the wireless antenna 10b than the connector 274" and the condition that "the connector 271a is farther away from the wireless antenna 10b than the connector 271b". The conditions also include that the condition that "as compared to the second flexible board 270b, the first flexible board 270a is disposed by way of a side of the control board 100 located farther away from the wireless antenna 10b than the other sides of the control board 100".

The control board 100 has a multilayered structure. As the control board 100, for example, a buildup board that is formed by laminating build-up layers on both sides of a plurality of core layers or an Any-Layer board in which all of laminated layers can have a connecting structure using interlayer vias. The high-speed transmission wiring 105 is configured such that wiring is extended on a surface layer of the control board 100 from the signal terminal line of the connector 102 and directly connected to a part of the signal terminals of the control IC 101. To laminate a number of conductive layers while making the board thickness of the control board 100 relatively small, clearance between the adjoining conductive layers is narrowed. In a case where the above configuration is adopted, if a high-speed transmission path is wired in a certain layer, only a ground plane is formed in a region, which overlaps the high-speed transmission path when it is projected onto a plane, on both sides of the conductive layer adjoining to the layer. Alternatively, by taking a measure such as removal of all or a part of the conductive layers by etching, the impedance of the high-speed transmission path can properly be controlled.

Such a measure occupies a certain area of the conductive layers and thus limits board wiring. Since the control IC 101 is an IC that controls image pickup signals, and a number of signal lines and power lines are connected to the signal terminals of the control IC 101, the wiring density in the region overlapping the control IC 101 is very high in many cases. By installing the high-speed transmission wiring 105 using the surface layer of the control board 100, the measure for keeping the impedance of the high transmission path constant is required to be taken for only one conductive layer that is one layer inside, and this increases flexibility of board wiring.

According to the present embodiment, the first wiring portion 276 of the first flexible board 270*a* is extended from the first connecting portion 275*a* in the downward direction (the first direction) perpendicular to the shooting optical axis P. On the other hand, the second wiring portion 277 of the first flexible board 270*a* is extended from the third connecting portion 275*b* in the upward direction (the second direction) perpendicular to the shooting optical axis P and opposite to the downward direction (the first direction). Namely, the first wiring portion 276 and the second wiring portion 277 are extended in direction opposite to each other in the vertical direction, and hence the loads on the movable unit 200*a* can be made nearly uniform when the movable unit 200*a* is displaced.

As a result, controlling the movement of the movable unit 200*a* does not become complicated, and power consumption is reduced. Moreover, the image pickup apparatus 10 is downsized because it is unnecessary to design the first and second flexible boards 270*a* and 270*b* such that the amount of deformation per unit length is excessively small.

The first wiring portion 276 and the second wiring portion 277 pass through the first cut 107*a* and the second cut 107*b* formed on the lower side and the upper side, respectively, of the control board 100. Even when the movable unit 200*a* is displaced to the greatest extent possible, the first wiring portion 276 and the second wiring portion 277 do not contact the first cut 107*a* and the second cut 107*b*, and hence an unexpected load is prevented from being applied to the movable unit 200*a* when the movable unit 200*a* is displaced.

Moreover, even when the movable unit 200*a* is displaced to the greatest extent possible, the first wiring portion 276 and the second wiring portion 277 fit into the outermost dimension of the control board 100 without protruding from the first cut 107*a* and the second cut 107*b*. Therefore, the control board 100 and the exterior 10*c* can be designed with only a small space left between them, and this contributes to downsizing of the image pickup apparatus 10.

Furthermore, since the first flexible board 270*a* on which much more electromagnetic field noise is produced than on the second flexible board 270*b* is placed farther away from the wireless antenna 10*b* than the second flexible board 270*b*, decrease in wireless performance is prevented.

It should be noted that to make the magnitudes of reaction forces generated by the first flexible board 270*a* and the second flexible board 270*b* substantially equal, the reaction forces may be determined from the viewpoint of bending strength including the thicknesses of the first and second wiring portions 276 and 277 as well as their lengths and widths. For example, the thicknesses of wiring paths in the first and second flexible boards 270*a* and 270*b* may be individually designed, and as for the first flexible board 270*a*, its thickness may be increased while its width is decreased on the condition that its cross sectional area is fixed. This makes the load on the second flexible board 270*b* equal to that on the first flexible board 270*a*. As a result, the width of the second flexible board 270*b* can be changed without changing the maximum rated current for the second flexible board 270*b*.

It should be noted that although the connector 103 is placed on the upper left of the connector 102 (FIG. 2), the connector 103 may be placed on the upper right of the connector 102. Although the connector 102 is placed in the lower part of the control board 100 so as to be away from the wireless antenna 10*b*, the connector 102 may be placed far from the wireless antenna 10*b* in the vertical or horizontal direction, depending on the location of the wireless antenna 10*b*. Thus, the locations of the connectors 102 and 102 can be modified in various ways.

It should be noted that it is unnecessary to configure the first and second flexible boards 270*a* and 270*b* and the third flexible board 240 as separate units, and they may be configured as an integral unit.

It should be noted that although in FIG. 10, the signal terminals are arranged at regular intervals and substantially parallel to a side of the package of the control IC 101, the signal terminals in the package should not necessarily be arranged as shown in FIG. 10. The signal terminals have only to be arranged such that connection with surface wiring of the control board 100 is possible, and they may be irregularly arranged. Also, a plug connector and a receptacle connector should not necessarily be adopted as components that connect boards together. A connector terminal portion may be formed in place of the connectors 273 and 274 on the first and second flexible boards 270*a* and 270*b*, and connectors compatible with the connector terminal portion may be mounted on the control board 100. It should be noted that although the connectors 232*a* and 232*b* (FIG. 4) and the connectors 271*a* and 272*b* (FIG. 3) are not plural, the present invention is not limited to this. For example, a plurality of connectors may be mounted on each of the first and second flexible boards 270*a* and 270*b*, a plurality of connectors may be mounted on the image pickup device board 231, and the corresponding ones of the mounted connectors may be connected together.

It should be noted that from the viewpoint of making the loads on the movable unit 200*a* uniform, the image blur correction unit 200 may be rotated 90 degrees such that the first wiring portion 276 and the second wiring portion 277 are extended in directions opposite to each other in the horizontal direction.

A second embodiment of the present invention is identical with the first embodiment except for the arrangements of the first and second flexible boards and the arrangement of the rear yoke. The second embodiment will be described with reference to FIG. 11 and FIG. 12. The components same as those of the first embodiment are designated by the same reference symbols, and detailed description thereof is omitted.

Figure 11:
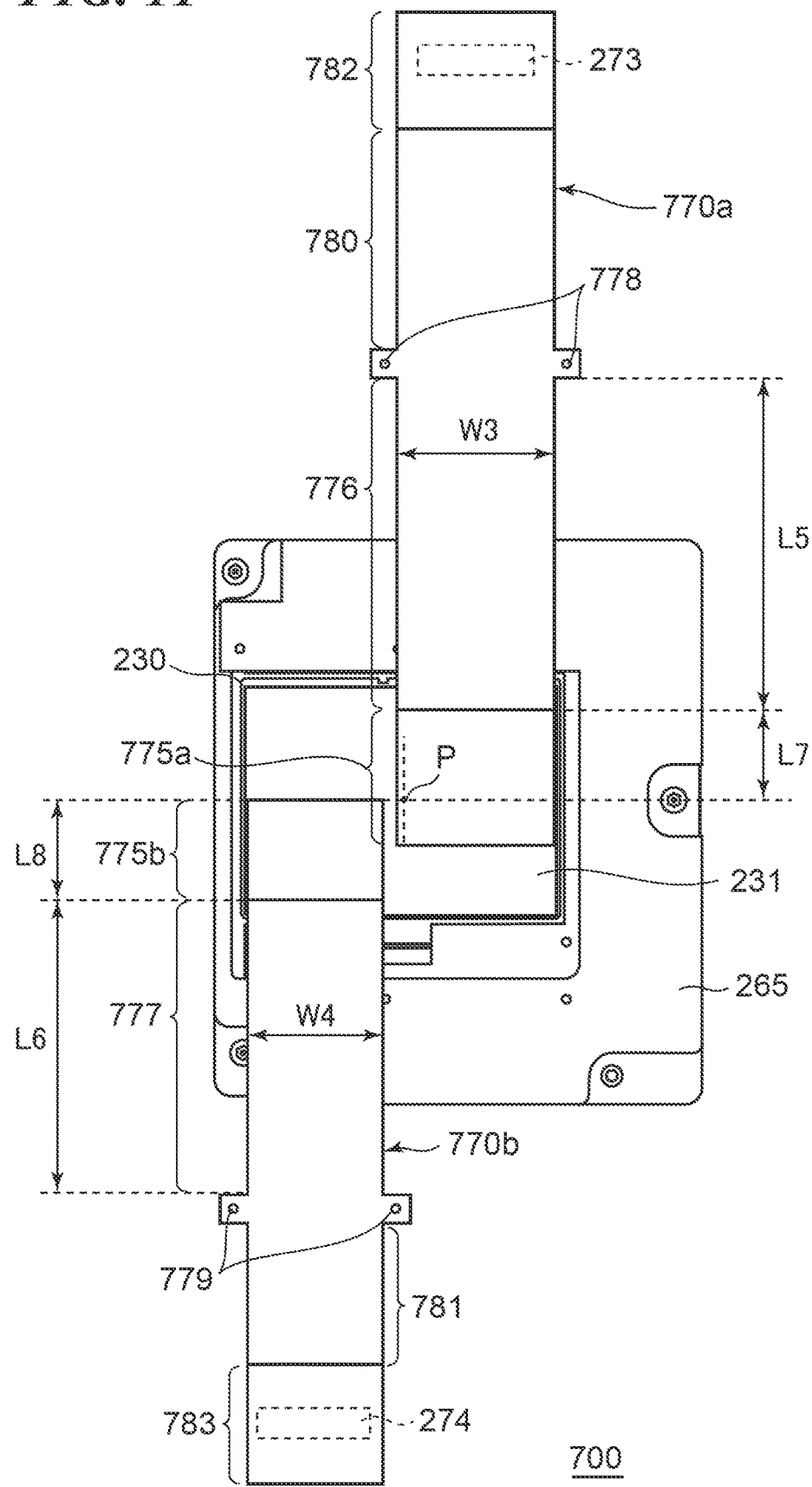
FIG. 11 is a rear view of the movable unit to which the first and second flexible boards are fixed.
Figure 12:
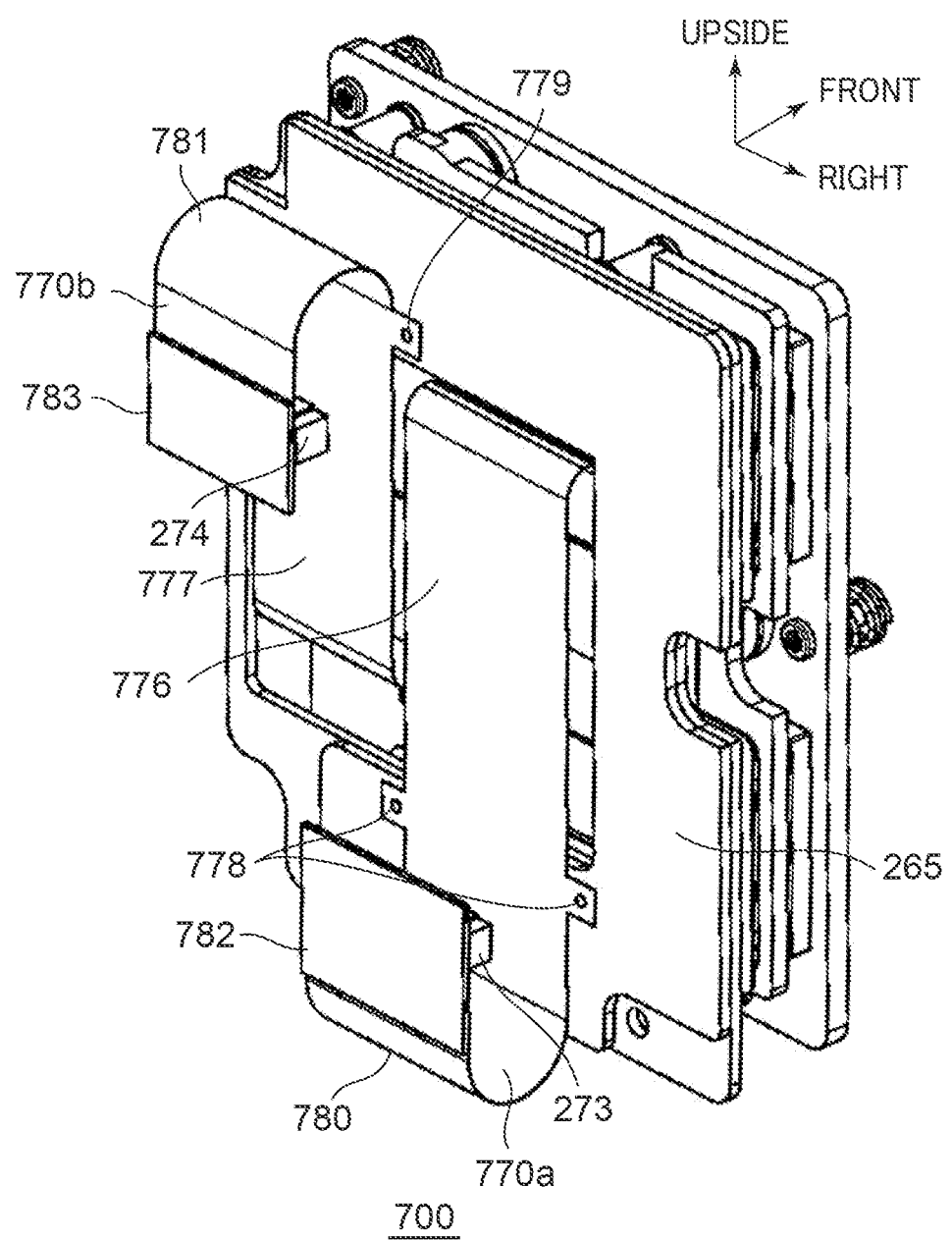
FIG. 12 is a perspective view of the image blur correction unit.

FIG. 11 is a rear view of the movable unit 200*a* to which the first and second flexible boards are fixed. FIG. 12 is a perspective view of the image blur correction unit 700. An image blur correction unit 700 corresponding to the image blur correction unit 200 has a first flexible board 770*a* and a second flexible board 770*b* corresponding to the first flexible board 270*a* and the second flexible board 270*b*, respectively. The image blur correction unit 700 has a rear yoke 265 corresponding to the rear yoke 260. The rear yoke 265 has a flat shape, and its outer shape is square U-shaped as seen from the direction of the optical axis P.

The first flexible board 770*a* has a first connecting portion 775*a*, a wiring portion 776, a wiring portion 780, and a second connecting portion 782 in order from the one closest to the connector 271a (FIG. 3) in a wiring direction (longitudinal direction). The connector 271a is placed in the first connecting portion 775a, and the connector 273 is placed in the second connecting portion 782. As compared to the first flexible board 270a, the first connecting portion 775a corresponds to the first connecting portion 275a, the wiring portion 776 and the wiring portion 780 correspond to the first wiring portion 276, and the second connecting portion 782 corresponds to the second connecting portion 278.

The second flexible board 770b has a third connecting portion 775b, a wiring portion 777, a wiring portion 781, and a fourth connecting portion 783 in order from the one closest to the connector 271b (FIG. 3) in a wiring direction (longitudinal direction). The third connecting portion 775b corresponds to the third connecting portion 275b, the wiring portion 777 and the wiring portion 781 correspond to the second wiring portion 277, and the fourth connecting portion 783 corresponds to the fourth connecting portion 279.

The wiring portion 776 of the first flexible board 770a is extended from the first connecting portion 775a in an upward direction perpendicular to the shooting optical axis P. The wiring portion 777 of the second flexible board 770b is extended from the third connecting portion 775b in a downward direction perpendicular to the shooting optical axis P and opposite to the upward direction.

On the first flexible board 770a, a wiring path is formed which electrically connects the connector 271a mounted on the first connecting portion 775a to the connector 273 mounted on the second connecting portion 782 via the wiring portion 776 and the wiring portion 780. On the second flexible board 770b, a wiring path is formed which electrically connects the connector 271b mounted on the third connecting portion 775b to the connector 274 mounted on the fourth connecting portion 783 via the wiring portion 777 and the wiring portion 781.

First fixed portions 778 are formed in the middle of the wiring portion between the first connecting portion 775a and the second connecting portion 782 in the wiring direction of the first flexible board 770a. Namely, the first fixed portions 778 are provided between the wiring portion 776 and the wiring portion 780 and fixed to the rear yoke 265. On the other hand, second fixed portions 779 are formed in the middle of the wiring portion between the third connecting portion 775b and the fourth connecting portion 783 in the wiring direction of the second flexible board 770b. Namely, the second fixed portions 779 are provided between the wiring portion 777 and the wiring portion 781 and fixed to the rear yoke 265. Holes for alignment with the rear yoke 265 are formed in the first fixed portions 778 and the second fixed portions 779. The operator uses a jig or the like to align the first and second fixed portions 778 and 779 with corresponding holes of the rear yoke 265 and then fix them to the rear yoke 265. Since the first and second fixed portions 778 and 779 are fixed to the rear yoke 265, the positions of the first and second portions 778 and 779 and areas on the second connecting portion 782 side and the fourth connecting portion 783 side of the first and second fixed portions 778 and 779 are not displaced.

The wiring portion 776 is warped a predetermined amount, and in this state, the first fixed portions 778 are fixed to the rear yoke 265 to keep the wiring portion 776 warped. Likewise, the wiring portion 777 is warped a predetermined amount, and in this state, the second fixed portions 779 are fixed to the rear yoke 265 to keep the wiring portion 777 warped. The amount by which the wiring portions 776 and 777 are warped is determined such that when the movable unit 200a is displaced to a position farthest from the optical axis P, the wiring portions 776 and 777 can be kept warped the predetermined amount without being stretched.

In a horizontal direction, the distance between the wiring portions 776 and 777 is equal to or greater than a maximum amount of translational movement of the movable unit 200a in the horizontal direction. This prevents the wiring portions 776 and 777 from interfering with each other and affecting the loads when correcting for image blurring.

As described above, the wiring portions 776 and 777 are routed in two routes i.e. upper and lower routes which are translational directions of the movable unit 200a (directions opposite to each other). Thus, as with the first embodiment, the loads arising from deformation of the first and second flexible boards 770a and 770b can be made nearly equal when the movable unit 200a is moved rightward and when the movable unit 200a is moved leftward. Also, the loads arising from deformation of the first and second flexible boards 770a and 770b can be made nearly equal when the movable unit 200a is moved upward and when the movable unit 200a is moved downward.

A length from a boundary between the first connecting portion 775a and the wiring portion 776 to the first fixed portions 778 is designated by L5. A length from a boundary between the third connecting portion 775b and the wiring portion 777 to the second fixed portions 779 is designated by L6. A length from the optical axis P to a boundary between the first connecting portion 775a and the wiring portion 776 is designated by L7, and a length from the optical axis P to a boundary between the third connecting portion 775b and the wiring portion 777 is designated by L8. A width of the wiring portion 776 and a width of a wiring portion 777 in the horizontal direction are designated by W3 and W4, respectively.

To make the loads arising from deformation of the first and second flexible boards 770a and 770b more equal, it is preferred that the length L5 and the length L6 are substantially equal, and the length L7 and the length L7 are substantially equal. It is also preferred that the width W3 and the width W4 are substantially equal. It is preferred that at least the wiring portion 776 and the wiring portion 777 have substantially the same length and width. This makes the loads arising from the deformation of the first and second flexible boards 770a and 770b more nearly equal and further contributes to downsizing of the image pickup apparatus 10 and reduction of power consumption.

According to the present embodiment, the wiring portion 776 and the wiring portion 777 are extended in the directions opposite to each other in the vertical direction. Thus, the same effects as those in the first embodiment are obtained from the viewpoint of making the loads applied to the movable unit 200a when it is displaced nearly equal.

Moreover, mainly the wiring portion 776 and the wiring portion 777 are warped, while the areas on the second connecting portion 782 side and the fourth connecting portion 783 side of the fixed portions 778 and 779 are hardly warped. It is thus unnecessary to form the cuts 107a and 107b of the control board 100 with margins considering the maximum displacement of the movable unit 200a. This increases the board area of the control board 100 and is also advantageous to making the lengths of the high-speed transmission paths wired inside the first flexible board 770a equal and forming the wiring portion 780 in a suitable shape. Therefore, the flexibility in the layout and wiring of the control board 100 is increased while high transmission quality of the high-speed transmission paths is ensured.

It should be noted that the first fixed portions 778 and the second fixed portions 779 may not be directly fixed to the rear yoke but may be fixed to the rear yoke 265 via separate holding members or the like. In this case, the holding members may have cylindrical positioning portions, which are fitted into the holes formed in the first and second fixed portions 778 and 779.

It should be noted that in the wiring portions 776 and 777, slits or the like may be formed in, for example, a direction parallel to the wiring path so as to reduce the loads arising from the deformation. This is advantageous to controlling the image blur correction unit 700 with high accuracy.

A third embodiment of the present invention is identical with the second embodiment except for the arrangements of the first and second flexible boards. The present embodiment will be described with reference to FIGS. 13, 14, and 15. The same component elements as those of the image pickup apparatus 10 according to the second embodiment are designated by the same reference symbols, and detailed description thereof is omitted. It should be noted that some reference symbols are omitted from FIGS. 13, 14, and 15.

Figure 13:
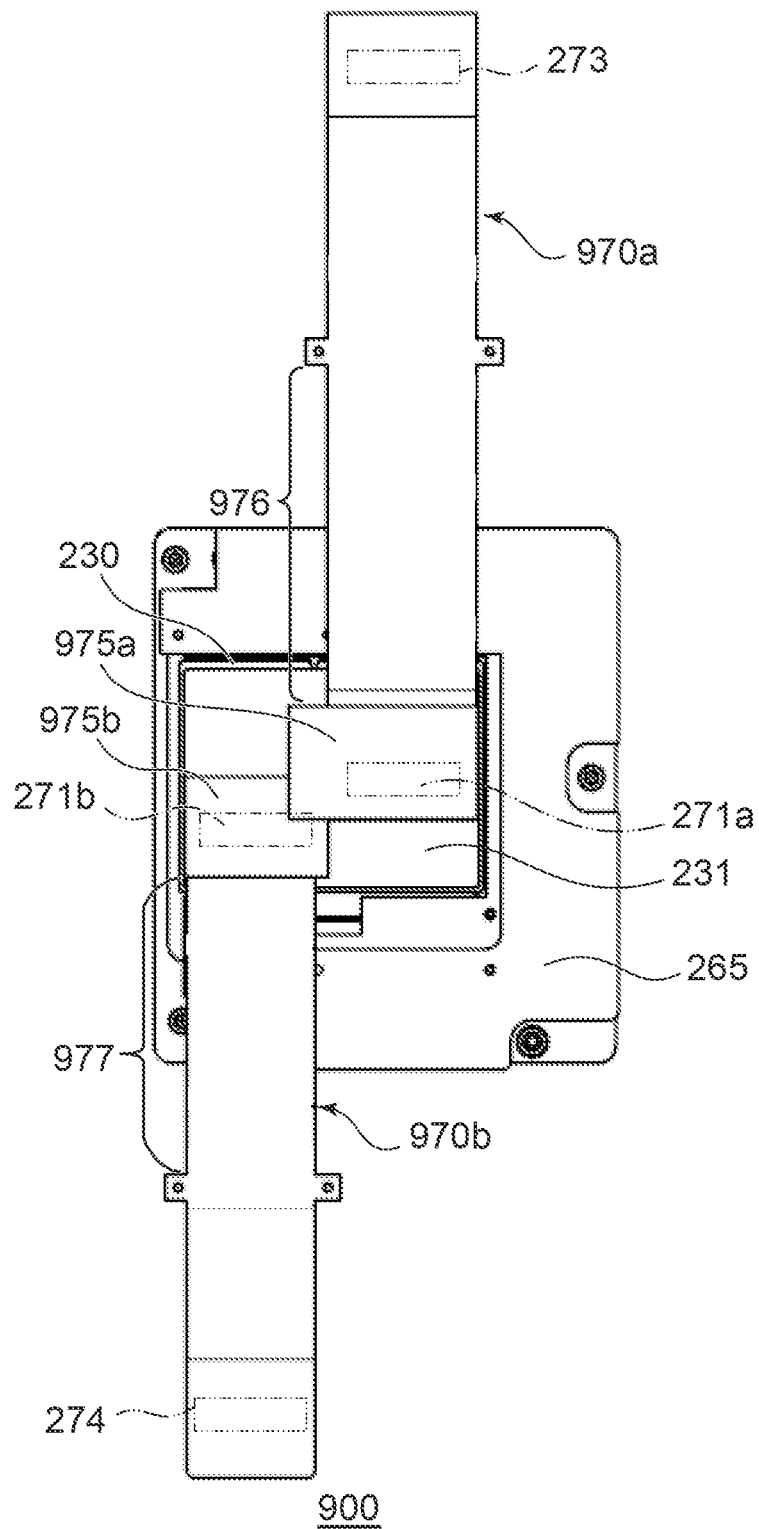
FIG. 13 is a rear view of the movable unit to which the first and second flexible boards are fixed.
Figure 14:
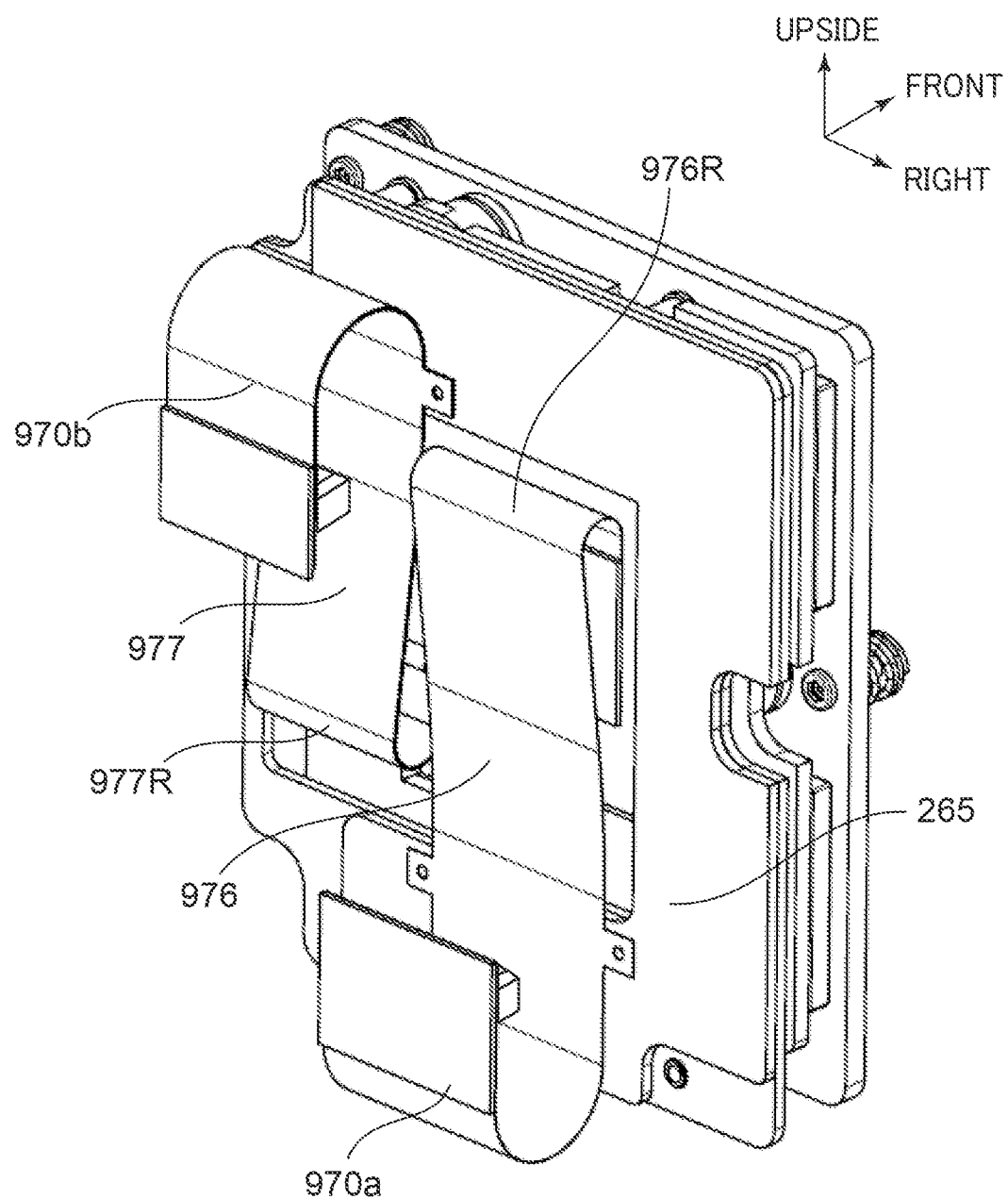
FIG. 14 is a perspective view of the image blur correction unit.
Figure 15:
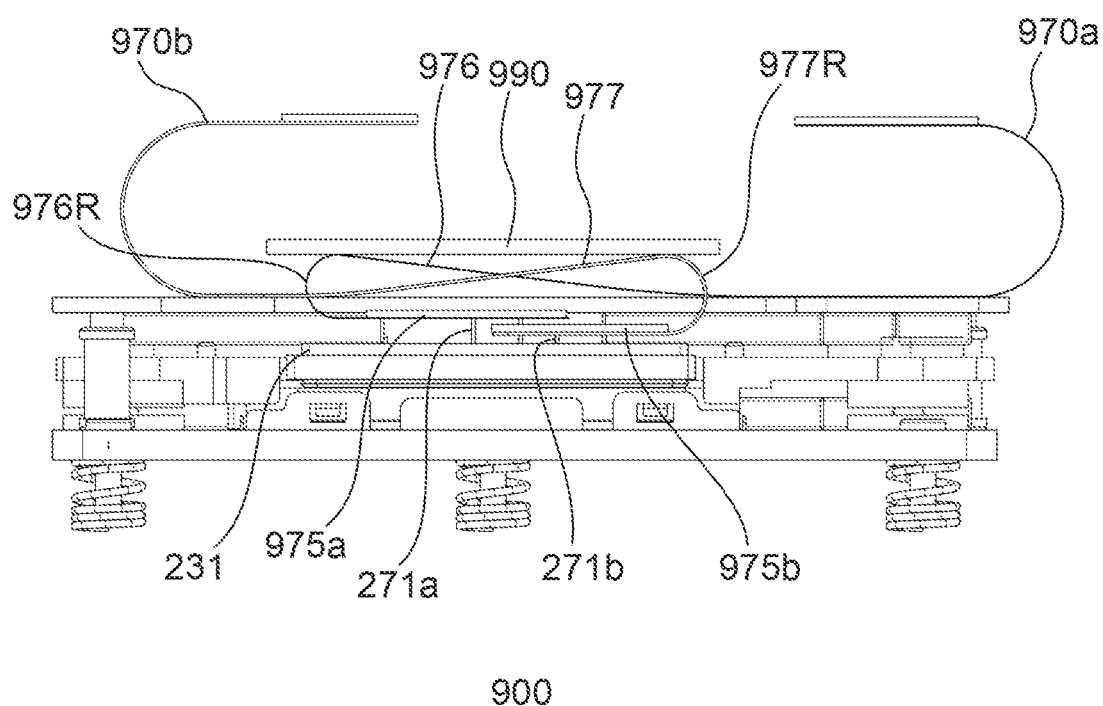
FIG. 15 is a side view of the image blur correction unit.

FIG. 13 is a rear view of the movable unit 200a to which the first and second flexible boards are fixed. FIG. 14 is a perspective view of an image blur correction unit. FIG. 15 is a perspective view of the image blur correction unit in FIG. 14 as seen from the left.

The image blur correction unit 900 corresponds to the image blur correction unit 700. As shown in FIG. 13, the image blur correction unit 900 has a first flexible board 970a and a second flexible board 970b corresponding to the first flexible board 770a and the second flexible board 770b, respectively. As compared with the first flexible board 770a, a wiring portion 976 and a first connecting portion 975a of the first flexible board 970a correspond to the wiring portion 776 and the first connecting portion 775a, respectively. As compared to the second flexible board 770b, a wiring portion 977 and a third connecting portion 975b of the second flexible board 970b correspond to the wiring portion 777 and the third connecting portion 775b, respectively.

The connector 271a is placed in the first connecting portion 975a, and the connector 271b is placed in the third connecting portion 975b. There may be cases where the first connecting portion 975a of the first flexible board 970a and the third connecting portion 975b of the second flexible board 970b are enlarged due to wire routing and overlap each other as seen from behind (in the direction of the optical axis). When the first connecting portion 975a and the third connecting portion 975b overlap each other, locations at which they are placed should be shifted in a direction parallel to the shooting optical axis P as described hereafter.

In the present embodiment, both the first connecting portion 975a and the third connecting portion 975b can be placed by, for example, making the height (thickness) of the connector 271a greater than that of the connector 271b. Thus, in the direction of the optical axis, the third connecting portion 975b is farther away from the control board 100 (closer to the movable unit 200a) than the first connecting portion 975a. On the other hand, an obstacle 990 is sometimes placed between the control board 100 and the image blur correction unit 200 as shown in FIG. 15. The obstacle 990 is omitted from FIG. 14 for the simplification of explanation. The obstacle 990 is a member equipped with a function of, for example, dissipating heat of the control board 100.

The wiring portion 977 of the second flexible board 970b has a curved portion 977R and passes between the third connecting portion 975b and the obstacle 990 to extent toward the control board 100. The wiring portion 976 of the first flexible board 970a has a curved portion 976R and passes between the first connecting portion 975a and the obstacle 990 to extend toward the control board 100. Here, the distance between the third connecting portion 975b and the obstacle 990 is longer than the distance between the first connecting portion 975a and the obstacle 990. A radius of curvature of the curved portion 977R of the wiring portion 977 is greater than that of the curved portion 976R of the wiring portion 976.

Here, it is preferred that the first and second flexible boards 970a and 970b have substantially the same thickness, but there may be cases where the second flexible board 970a is designed to be thicker because it is for power wiring. In the present embodiment, it is assumed that the second flexible board 970b is thicker than the first flexible board 970a.

When the obstacle 990 and the image blur correction unit 200 are located close to each other, there is the possibility that the first and second flexible boards 970a and 970b may move while being in contact with the obstacle 990 when the movable unit 200a is movable. Moreover, since the second flexible board 970b thicker than the first flexible board 970a is less likely to be deformed than the second flexible board 970b, the loads applied to the first and second flexible boards 970a and 970b tend to be unequal.

However, the distance from the third connecting portion 975b to the obstacle 990 in the direction of the optical axis is longer than the distance from the first connecting portion 975a to the obstacle 990 in the direction of the optical axis, and hence it is possible to design the curved portion 977R with a greater radius of curvature than that of the curved portion 976R. As a result, reaction forces generated by deformations of the respective wiring portions 976 and 977 can be made nearly equal.

According to the present embodiment, the same effects as those in the first and second embodiment are obtained from the viewpoint of making the loads applied to the first and second flexible boards 970a and 970b when the movable unit 200a is displaced nearly equal.

Moreover, since the first connecting portion 975a and the third connecting portion 975b overlap each other, enough installation space is secured in a direction vertical to the direction of the optical axis even if the first and second connecting portions 975a and 975b are designed such that the areas thereof are large.

Furthermore, since the third connecting portion 975b is farther away from the control board 100 than the first connecting portion 975a, the radius of curvature of the curved portion 977R is greater than that of the curved portion 976R. Thus, even in the case where the second flexible board 970b is thicker than the first flexible board 970a, reaction forces generated by deformations of the respective wiring portions 976 and 977 can be made nearly equal.

It should be noted that in the present embodiment, the first and second connecting portions 975a and 975b are placed at different locations in the direction of the optical axis by making the connector 271a and the connector 271b with different heights (thicknesses). The present invention, however, is not limited to this, but the connector 232a and the connector 232b mounted on the image pickup device board 231 may have different heights (thicknesses). Alternatively, the connector 271a and the connector 271b may have different heights (thicknesses), and the connector 232a and the connector 232b may also have different heights (thicknesses).

It should be noted that from the viewpoint of achieving the balance of the loads, it is preferred that the connecting portion which is a thicker one of the first and second flexible boards 970a and 970b is placed farther away from the control board 100. Thus, in terms of the locations at which the connecting portions are placed and the thicknesses of the flexible boards, the relationships may be opposite to those illustrated in the present embodiment.

It should be noted that the locations at which the connecting portions are placed and the thicknesses of the flexible boards in the present embodiment may be applied to the first embodiment as well.

It should be noted that the present invention may be applied not only to an image pickup apparatus such as a camera but also to a variety of electronic equipment in which a movable unit that is movably supported and a control board are connected together via a flexible board. Moreover, when the present invention is applied to a camera, the camera may be an integral lens type.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Some of the above embodiments may be used in combination as appropriate.

This application claims the benefit of Japanese Patent Application No. 2018-195149, filed Oct. 16, 2018, and Japanese Patent Application No. 2019-117500, filed Jun. 25, 2019, which are hereby incorporated by reference herein in its their entireties.

What is claimed is:

1. An image pickup apparatus comprising:
    a wireless antenna at an upper part of the image pickup apparatus;
    an image pickup device configured to convert an optical image of a subject into an electric signal;
    a movable unit configured to hold the image pickup device and to be capable of being displaced in a direction different from a direction of an optical axis of an image pickup optical system;
    a control unit including a circuit to which an image pickup signal output from the image pickup device is transmitted;
    a first flexible board configured to electrically connect the movable unit and the control unit with each other; and
    a second flexible board configured to electrically connect the movable unit and the control unit with each other,
    wherein the first flexible board comprises a first connecting portion that is connected to the movable unit, a first wiring portion that is extended from the first connecting portion in a first direction different from the direction of the optical axis, and a second connecting portion that is placed at an end of the first wiring portion and connected to the control unit,
    wherein the second flexible board comprises a third connecting portion that is connected to the movable unit, a second wiring portion that is extended from the third connecting portion in a second direction different from the direction of the optical axis and different from the first direction, and a fourth connecting portion that is placed at an end of the second wiring portion and connected to the control unit,
    wherein the second connecting portion is placed farther away from an installation location of the wireless antenna than the fourth connecting portion,
    wherein the first flexible board comprises differential transmission wiring, and the second flexible board comprises power wiring, and
    wherein an amount of electromagnetic field noise of the first flexible board is larger than an amount of electromagnetic field noise of the second flexible board.

2. The image pickup apparatus according to claim 1, wherein the first direction is a direction away from the wireless antenna and the second direction is a direction approaching the wireless antenna.

3. The image pickup apparatus according to claim 1, wherein the control unit has a function of optically correcting for blurring of the subject by displacing the movable unit in a direction different from the optical axis.

4. The image pickup apparatus according to claim 1, wherein the second direction is a direction away from the wireless antenna and the first direction is a direction approaching the wireless antenna.

* * * * *